United States Patent
Ma et al.

(10) Patent No.: US 11,926,773 B2
(45) Date of Patent: Mar. 12, 2024

(54) ORGANIC-INORGANIC HYBRID PEROVSKITES, DEVICES, AND METHODS

(71) Applicant: Florida State University Research Foundation, Inc., Tallahassee, FL (US)

(72) Inventors: Biwu Ma, Tallahassee, FL (US); Zhao Yuan, Tallahassee, FL (US); Chenkun Zhou, Tallahassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 237 days.

(21) Appl. No.: 17/385,049

(22) Filed: Jul. 26, 2021

(65) Prior Publication Data

US 2021/0348053 A1   Nov. 11, 2021

Related U.S. Application Data

(62) Division of application No. 15/669,249, filed on Aug. 4, 2017, now Pat. No. 11,078,413.

(60) Provisional application No. 62/370,978, filed on Aug. 4, 2016.

(51) Int. Cl.
   C09K 11/66    (2006.01)
   C07F 7/24     (2006.01)
   (Continued)

(52) U.S. Cl.
   CPC .............. *C09K 11/06* (2013.01); *C07F 7/24* (2013.01); *C09K 11/57* (2013.01); *C09K 11/664* (2013.01);
   (Continued)

(58) Field of Classification Search
   CPC ....... C09K 11/06; C09K 11/02; C09K 11/025; C09K 11/57; C09K 11/664;
   (Continued)

(56) References Cited

U.S. PATENT DOCUMENTS 6,150,536 A      11/2000  Chondroudis
6,429,318 B1 *    8/2002  Mitzi ................ H01L 21/02282
                                                           549/3
(Continued)

FOREIGN PATENT DOCUMENTS

WO    2015/035216 A1    3/2015
WO    2016/094966 A1    6/2016

OTHER PUBLICATIONS

Mitzi, et al., "Synthesis and Characterization of [NH2C(I)=NH2]2ASnI5 with A = Iodoformamidinium or Formamidinium: The Chemistry of Cyanamide and Tin(II) Iodide in Concentrated Aqueous Hydriodic Acid Solutions", Inorg. Chem. 1998, 37(2), 321-327.
(Continued)

*Primary Examiner* — Matthew E. Hoban
*Assistant Examiner* — Lynne Edmondson
(74) *Attorney, Agent, or Firm* — Eversheds Sutherland (US) LLP

(57) ABSTRACT

Provided herein are organic-inorganic hybrid-perovskites, including metal halide perovskites having a 1D crystal structure. The metal halide perovskites may be luminescent. The metal halide perovskites may include a dopant, including an emitter dopant. Methods of forming metal halide perovskites, and devices including the metal halide perovskites also are provided.

19 Claims, 12 Drawing Sheets

(51) Int. Cl.
C09K 11/06 (2006.01)
C09K 11/57 (2006.01)
C30B 7/14 (2006.01)
C30B 29/12 (2006.01)
C30B 29/54 (2006.01)
H10K 85/30 (2023.01)
H10K 50/11 (2023.01)
H10K 50/135 (2023.01)

(52) U.S. Cl.
CPC ............... C30B 7/14 (2013.01); C30B 29/54 (2013.01); H10K 85/30 (2023.02); C09K 2211/188 (2013.01); H10K 50/11 (2023.02); H10K 50/135 (2023.02)

(58) Field of Classification Search
CPC . C09K 2211/10; C09K 2211/188; C30B 7/14; C30B 29/12; C07F 7/24; H01L 33/502
See application file for complete search history.

(56) References Cited

U.S. PATENT DOCUMENTS 9,896,462 B1 2/2018 Ma
11,466,040 B2 * 10/2022 Ma ..................... H10K 50/115
2017/0283693 A1 10/2017 Ma

OTHER PUBLICATIONS

Mousdis, et al., "Preparation, structure and optical properties of [CH3SC(=NH2)NH2]3PbI5, [CH3SC(=NH2)NH2]4Pb2Br8 and [CH3SC(=NH2)NH2]3PbCl5·CH3SC(=NH2)NH2Cl", J. Mater. Chem., 1998, 8(10), 2259-2262.

Tanaka, et al., "One-dimensional excitons in inorganic-organic self-organized quantum-wire crystals [NH2C(I)=NH2]3PbI5 and [CH3SC(=NH2)NH2]3PbI5", Physica E-Low-Dimensional Systems & Nanostructures 2005, 25(4), 378-383.

Wang, et al., "Synthesis and Characterization of [NH2C(I)=NH2]3MI5 (M = Sn, Pb): Stereochemical Activity in Divalent Tin and Lead Halides Containing Single <110> Perovskite Sheets", J. Am. Chem. Soc., 1995, 117(19), 5297-5302.

Yaun, et al., "One-dimensional organic lead halide perovskites with efficient bluish white-light emission", B. Nat. Commun., 2017, 8:14051, 1-7.

Lemmerer, "Phase transitions and structural motifs of inorganic-organic lead halide hybrids", 2008, WiredSpace (abstract).

Billing et al., "Lead halide inorganic-organic hybrids incorporating diammonium cations", 2012, CrystEngComm, 14, pp. 1954-1966.

Dohner et al., "Self-Assembly of Broadband White-Light Emitters", Journal of the American Chemical Society, 2014, pp. 1718-1721.

* cited by examiner

ORGANIC-INORGANIC HYBRID PEROVSKITES, DEVICES, AND METHODS

CROSS REFERENCE TO RELATED APPLICATION

This application is a divisional of U.S. patent application Ser. No. 15/669,249, filed Aug. 4, 2017, which claims priority to U.S. Provisional Patent Application No. 62/370,978, filed Aug. 4, 2016. The contents of these applications are incorporated herein by reference.

BACKGROUND

Earth abundant organic-inorganic hybrid perovskites have received attention for their unique properties, such as low-temperature solution processability and highly tunable band structure, which may be desirable for new optoelectronic devices. Advances have been realized for perovskite based photovoltaic cells (PVs), with rapid improvement of device efficiencies to as high as about 20%. Efficient light emitting diodes (LEDs) and optically pumped lasers have also been demonstrated that include these hybrid materials as light emitters.

Atomically thin two-dimensional (2D) perovskite sheets with well-defined square shapes and tunable luminescence have been prepared by solution phase growth, but broadband white-light emission with a quantum efficiency of only 9% or less has been achieved with the 2D perovskites, likely due to exciton self-trapping in the inter-layer inorganic quantum wells.

To obtain pure white emission, a variety of device architectures have been developed using different combinations of UV/blue LEDs and phosphors, including (i) a blue LED chip with a yellow phosphor or a mixture of green and red phosphors, (ii) a UV LED with multiple monochromatic blue, green, and red phosphors, and (iii) a UV LED with a single broadband white phosphor. The latter approach may simplify device fabrication, and/or reduce or eliminate one or more disadvantages associated with the former approaches, such as poor color rendition (due to the phosphors' narrow emissions), efficiency loss (due to self-absorption), and/or the change of emission color over time (due to different degradation rates of individual phosphors).

There remains a need for organic-inorganic hybrid perovskites that are easily created, easily processible, rely on inexpensive materials, capable of highly efficient light emission, including white-light emission, and/or capable of functioning as a single broadband white phosphor.

BRIEF SUMMARY

In one aspect, one-dimensional (1D) metal halide perovskites are provided that may be luminescent. The 1D metal halide perovskites may have tunable broadband emissions ranging from bluish-white to white to red. The broadband emissions may be attributed to the exciton self-trapping in the quantum confined 1D structures. The 1D metal halide perovskites provided herein, including the 1D metal halide perovskites that include a dopant, may function as a single broadband white phosphor. In some embodiments, the metal halide perovskites provided herein include a 1D crystal structure that includes a unit cell according to formula (I)—

$$RMX_4 \quad (I);$$

wherein M is a metal atom selected from Pb, Sn, Cu, Ge, Mn, Co, Bi, Sb, or Eu; X is a halide ion selected from Cl, Br, or I; and R is an organic cation including at least one secondary ammonium cation, at least one tertiary ammonium cation, or a combination thereof. The metal halide perovskites provided herein also may include a dopant. A dopant may be present in the metal halide perovskites at a ratio of about 0.995:0.005 to about 0.90:0.1 (metal atom: dopant), as determined by X-ray fluorometer. In some embodiments, the dopant includes $Mn^{2+}$ ions. In some embodiments, the dopant includes $Mn^{2+}$ ions, $Eu^{3+}$ ions, $Pr^{3+}$ ions, or a combination thereof.

In another aspect, devices are provided that include a metal halide perovskite having a 1D crystal structure. In some embodiments, the metal halide perovskites are light emitting materials. The metal halide perovskites may emit light that is white, blue, green, yellow, orange, or red. The devices may include a light emitting diode, a light emitting electrochemical cell, or an optically pumped laser.

In yet another aspect, methods of making metal halide perovskites are provided. In some embodiments, the methods include providing a liquid formulation including (i) a metal halide, (ii) an organic ligand, (iii) an organic acid, and (iv) a liquid hydrocarbon; and agitating the liquid formulation to form a metal halide perovskite having a 1D crystal structure, wherein the organic ligand includes at least one secondary amine, at least one tertiary amine, or a combination thereof. In some embodiments, the methods include providing an aqueous formulation including (i) a metal halide, (ii) an organic ligand, and (iii) a hydrogen halide; and contacting the aqueous formulation with a precipitant to form a metal halide perovskite having a 1D crystal structure; wherein the organic ligand includes at least one secondary amine, at least one tertiary amine, or a combination thereof. In some embodiments, the methods include providing a precursor formulation comprising (i) a metal halide, (ii) an organic cation, (iii) a manganese halide, and (iv) a liquid; and contacting the precursor formulation with a precipitant to form a doped metal halide perovskite, wherein the organic cation comprises at least one secondary ammonium cation, at least one tertiary ammonium cation, or a combination thereof, and the mol ratio of the metal halide to the manganese halide in the precursor formulation is about 8:1 to about 1:1.

DETAILED DESCRIPTION

Figure 1:
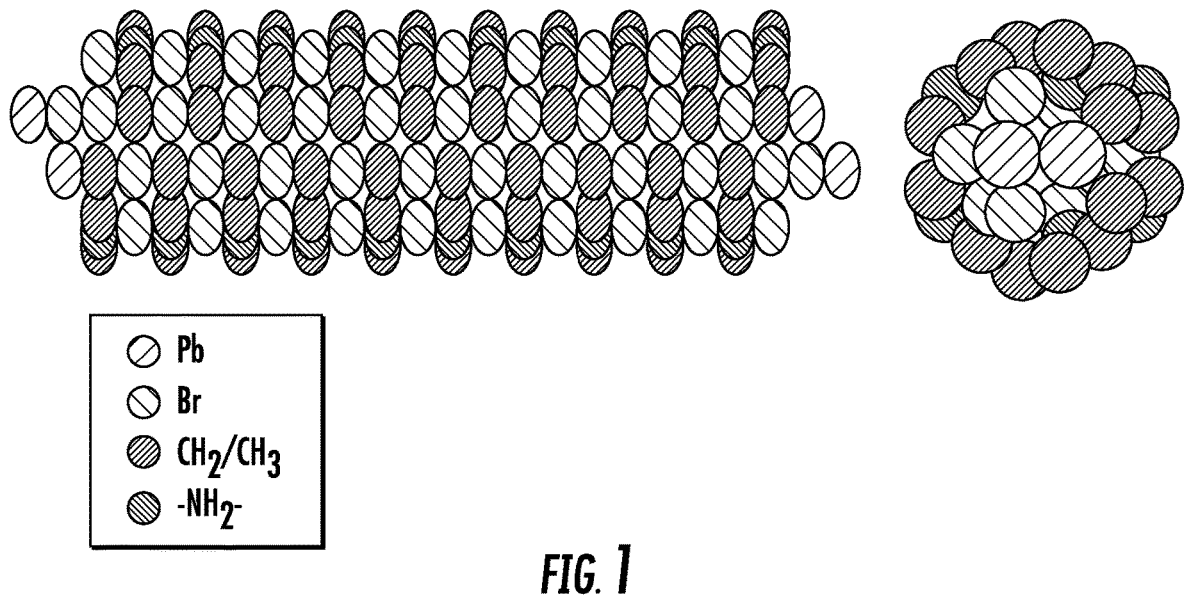
FIG. 1 depicts side and end views of an embodiment of a lead bromide quantum wire wrapped by an embodiment of organic cations.

Provided herein are organic-inorganic hybrid perovskites having a structure that may permit strong quantum confinement with the formation of self-trapped excited states. In some embodiments, the organic-inorganic hybrid perovskites demonstrate efficient light emission with a quantum efficiency of at least 20%. In some embodiments, the organic-inorganic hybrid perovskites are light emitting materials in various devices, including an effective down conversion phosphor in UV pumped white light emitting diodes.

In some embodiments, the organic-inorganic hybrid perovskites provided herein are metal halide perovskites that include a 1D crystal structure including a unit cell according to formula (I)—

$$RMX_4 \quad (I);$$

wherein M is a metal atom selected from Pb, Sn, Cu, Ge, Mn, Co, Bi, Sb, or Eu; X is a halide ion selected from Cl, Br, or I; and R is an organic cation. The organic cation may include at least one secondary ammonium cation, at least one tertiary ammonium cation, or a combination thereof.

In some embodiments, the organic cation is N, N'-dimethylethane-1,2-diammonium, M is Pb, X is Cl, and the unit cell has the following formula: $(C_4N_2H_{14})PbCl_4$. In some embodiments, the organic cation is N, N'-dimethylethane-1,2-diammonium, M is Pb, X is Br, and the unit cell has the following formula: $(C_4N_2H_{14})PbBr_4$. In some embodiments, the organic cation is N, N'-dimethylethane-1,2-diammonium, M is Pb, X is I, and the unit cell has the following formula: $(C_4N_2H_{14})PbI_4$.

In some embodiments, the metal halide perovskites having a 1D crystal structure including a unit cell according to formula (I) are luminescent, and have a photoluminescence quantum efficiency (PLQE) of at least 1%, at least 3%, at least 5%, at least 8%, at least 10%, at least 12%, at least 15%, at least 18%, at least 20%, at least 22%, at least 25%, at least 26%, at least 28%, or at least 30%.

In some embodiments, the organic cation is N, N'-dimethylethane-1,2-diammonium, M is Pb, X is Cl, and the unit cell has the following formula: $(C_4N_2H_{14})PbCl_4$, and the metal halide perovskite has a photoluminescence quantum efficiency (PLQE) of at least 1%, at least 3%, at least 5%, at least 8%, at least 10%, at least 12%, at least 15%, at least 18%, at least 20%, at least 22%, at least 25%, at least 26%, at least 28%, or at least 30%. In some embodiments, the organic cation is N, N'-dimethylethane-1,2-diammonium, M is Pb, X is Br, and the unit cell has the following formula: $(C_4N_2H_{14})PbBr_4$, and the metal halide perovskite has a photoluminescence quantum efficiency (PLQE) of at least 1%, at least 3%, at least 5%, at least 8%, at least 10%, at least 12%, at least 15%, at least 18%, at least 20%, at least 22%, at least 25%, at least 26%, at least 28%, or at least 30%. In some embodiments, the organic cation is N, N'-dimethylethane-1,2-diammonium, M is Pb, X is I, and the unit cell has the following formula: $(C_4N_2H_{14})PbI_4$, and the metal halide perovskite has a photoluminescence quantum efficiency (PLQE) of at least 1%, at least 3%, at least 5%, at least 8%, at least 10%, at least 12%, at least 15%, at least 18%, at least 20%, at least 22%, at least 25%, at least 26%, at least 28%, or at least 30%.

1D Crystal Structures

The phrases "one-dimensional structure" or "1D structure," as used herein, refer to crystal structures that include a core-shell quantum wire, wherein insulating organic shells provided by the organic cations at least partially wrap around a core metal halide chain. The 1D crystal structures may include a bulk assembly of the core-shell quantum wires.

In some embodiments, the organic cation of formula (I) is $C_4N_2H_{14}^{2+}$, M is Pb, and the 1D crystal structure of the metal halide perovskites include $[PbX_4^{2-}]_\infty$ double chains wrapped by the $C_4N_2H_{14}^{2+}$ cations, which is an embodiment of a crystalline bulk assembly of core-shell quantum wires.

Dopants

In some embodiments, the metal halide perovskites provided herein also include a dopant. The dopant generally may be any material that may be incorporated into the metal halide perovskite without adversely impacting the performance of a metal halide perovskite, the 1D crystal structure of a metal halide perovskite, or a combination thereof.

The dopant may be a material that that emits light of a color that differs from the color of light emitted by a metal halide perovskite. The inclusion of a dopant, in some embodiments, may achieve the emission of white light from a metal halide perovskite. For example, the relatively strong quantum confinement in 1D crystal structures of lead bromide perovskites may lead to a blue shift of the light emission, which may result in a deficiency of red emission and a relatively low color-rendering index (CRI) of 66. The quality of white emission with high CRI may be improved by doping the lead bromide perovskite with a red emitting species, preferably without quenching the blue emission.

In some embodiments, the dopant includes $Mn^{2+}$ ions. In some embodiments, the dopant includes $Mn^{2+}$ ions, $Eu^{3+}$ ions, $Pr^{3+}$ ions, or a combination thereof.

In some embodiments, the 1D crystal structure of the metal halide perovskites provided herein include a dopant at a ratio (metal atom:dopant) of about 0.995:0.005 to about 0.90:0.1, 0.995:0.005 to about 0.95:0.05, 0.995:0.005 to about 0.97:0.03, 0.992:0.008 to about 0.97:0.03, about 0.992:0.008, about 0.987:0.013, or about 0:970:0.030, as determined by X-ray fluorometer.

In some embodiments, the dopant includes $Mn^{2+}$ ions, and the dopant is present at a ratio (metal atom:dopant) of about 0.995:0.005 to about 0.90:0.1, 0.995:0.005 to about 0.95:0.05, 0.995:0.005 to about 0.97:0.03, 0.992:0.008 to about 0.97:0.03, about 0.992:0.008, about 0.987:0.013, or about 0:970:0.030, as determined by X-ray fluorometer.

In some embodiments, the metal halide perovskites include a dopant, and have a photoluminescence quantum efficiency (PLQE) of at least 15%, at least 18%, at least 20%, at least 22%, at least 25%, at least 26%, at least 28%, or at least 30%.

Organic Cations/Ligands

The organic cation of formula (I) generally may have any structure that is compatible with the 1D crystal structure of the metal halide perovskites. For example, the organic cation may include one or more positively charged moieties, such as one or more positively charged amines. The positively charge amines can include primary (1°), secondary (2°), tertiary (3°), and/or quaternary (4°) ammonium cations. The positively charged moieties may interact favorably with the negatively charged halide ions in the metal halide perovskites. In some embodiments, the organic cation includes at least one secondary ammonium cation, at least one tertiary ammonium cation, or a combination thereof.

As used herein, the phrase "organic ligand" refers to any compound capable for forming an organic cation described herein upon exposure to an acid or an acidic environment having a pH sufficient to protonate the organic ligand. For example, N,N'-dimethylethylenediamine is an organic ligand, and its corresponding organic cation is N, N'-dimethylethane-1,2-diammonium.

In some embodiments, the organic cation is a $C_1$-$C_{20}$ hydrocarbyl or $C_6$-$C_{20}$ aryl substituted with at least one positively charged moiety, such as a positively charged amine. In some embodiments, the organic cation is a $C_1$-$C_{20}$ hydrocarbyl or $C_6$-$C_{20}$ aryl substituted with two to four positively charged moieties, such as two to four positively charged amines. In some embodiments, the organic cation is a $C_1$-$C_{20}$ hydrocarbyl or $C_6$-$C_{20}$ aryl that is substituted with at least one of a primary ammonium cation, a secondary ammonium cation, or a tertiary ammonium cation. In some embodiments, the organic cation is a $C_1$-$C_{20}$ hydrocarbyl or $C_6$-$C_{20}$ aryl that is substituted with two to four secondary ammonium cations. A primary ammonium cation may have the following structure: —$NH_3^+$. A secondary ammonium cation may have the following structure: —$NH_2R'^+$, wherein R' is a $C_1$-$C_{20}$ hydrocarbyl. A tertiary ammonium cation may have the following structure: —NHR"R'", wherein R" and R'" independently are a $C_1$-$C_{20}$ hydrocarbyl.

The phrase "$C_1$-$C_{20}$ hydrocarbyl," as used herein, generally refers to aliphatic groups containing from 1 to 20 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having from 1 to about 20 carbon atoms. Examples of alkyl groups include, but are not limited to, methyl, ethyl, propyl, isopropyl, n-butyl, t-butyl, isobutyl, pentyl, hexyl, isohexyl, heptyl, 4,4-dimethylpentyl, octyl, 2,2,4-trimethylpentyl, nonyl, decyl, undecyl and dodecyl. Cycloalkyl moieties may be monocyclic or multicyclic, and examples include cyclopropyl, cyclobutyl, cyclopentyl, cyclohexyl, and adamantyl. Additional examples of alkyl moieties have linear, branched and/or cyclic portions (e.g., 1-ethyl-4-methyl-cyclohexyl). Representative alkenyl moieties include vinyl, allyl, 1-butenyl, 2-butenyl, isobutylenyl, 1-pentenyl, 2-pentenyl, 3-methyl-1-butenyl, 2-methyl-2-butenyl, 2,3-dimethyl-2-butenyl, 1-hexenyl, 2-hexenyl, 3-hexenyl, 1-heptenyl, 2-heptenyl, 3-heptenyl, 1-octenyl, 2-octenyl, 3-octenyl, 1-nonenyl, 2-nonenyl, 3-nonenyl, 1-decenyl, 2-decenyl and 3-decenyl. Representative alkynyl moieties include acetylenyl, propynyl, 1-butynyl, 2-butynyl, 1-pentynyl, 2-pentynyl, 3-methyl-1-butynyl, 4-pentynyl, 1-hexynyl, 2-hexynyl, 5-hexynyl, 1-heptynyl, 2-heptynyl, 6-heptynyl, 1-octynyl, 2-octynyl, 7-octynyl, 1-nonynyl, 2-nonynyl, 8-nonynyl, 1-decynyl, 2-decynyl and 9-decynyl.

The phrase "$C_6$-$C_{20}$ aryl," as used herein, refers to aryl or aromatic moieties that include 6 to 20 carbon atoms. Examples of aryl or aromatic moieties include, but are not limited to, anthracenyl, azulenyl, biphenyl, fluorenyl, indan, indenyl, naphthyl, phenanthrenyl, phenyl, 1,2,3,4-tetrahydro-naphthalene, and the like, including substituted derivatives thereof. Substituted derivatives of aromatic compounds include, but are not limited to, tolyl, xylyl, mesityl, and the like, including any heteroatom substituted derivative thereof. Examples of cyclic groups, in each instance, include, but are not limited to, cycloparaffins, cycloolefins, cycloacetylenes, arenes such as phenyl, bicyclic groups and the like, including substituted derivatives thereof, in each instance having from about 3 to about 20 carbon atoms. Thus heteroatom-substituted cyclic groups such as furanyl are also included herein.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl, ethyl, propyl, t-butyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), aryl, aryloxy, azo, carbamoyl (—NHC(O)O— alkyl- or —OC(O)NH-alkyl), carbamyl (e.g., $CONH_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —$CCl_3$, —$CF_3$, —$C(CF_3)_3$), heteroalkyl, isocyanate, isothiocyanate, nitrile, nitro, phosphodiester, sulfide, sulfonamido (e.g., $SO_2NH_2$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

In some embodiments of the metal halide perovskite having a unit cell according to formula (I), the organic cation is a $C_1$-$C_{20}$ hydrocarbyl or $C_6$-$C_{20}$ aryl substituted with at least one positively charged moiety; M is Sn, Cu, Ge, Mn, Co, Pb, Bi, Sb, or Eu; and X is Cl, Br, or I. In some embodiments, the organic cation is a $C_1$-$C_{20}$ hydrocarbyl or $C_6$-$C_{20}$ aryl substituted with at least one positively charged moiety, M is Pb; X is Cl, Br or I. In some embodiments, the organic cation is a $C_1$-$C_{20}$ hydrocarbyl or $C_6$-$C_{20}$ aryl substituted with at least one positively charged moiety, M is Pb; and X is Cl. In some embodiments, the organic cation is a $C_1$-$C_{20}$ hydrocarbyl or $C_6$-$C_{20}$ aryl substituted with at least one positively charged moiety, M is Pb; and X is Br. In some embodiments, the organic cation is a $C_1$-$C_{20}$ hydrocarbyl or $C_6$-$C_{20}$ aryl substituted with at least one positively charged moiety, M is Pb; and X is I.

In some embodiments of the metal halide perovskite having a unit cell according to formula (I), the organic cation is a $C_1$-$C_{20}$ hydrocarbyl or $C_6$-$C_{20}$ aryl substituted with two positively charged moieties; M is Sn, Cu, Ge, Mn, Co, Pb, Bi, Sb, or Eu; and X is Cl, Br, or I. In some embodiments, the organic cation is a $C_1$-$C_{20}$ hydrocarbyl or $C_6$-$C_{20}$ aryl substituted with two positively charged moieties, M is Pb; X is Cl, Br or I. In some embodiments, the organic cation is a $C_1$-$C_{20}$ hydrocarbyl or $C_6$-$C_{20}$ aryl substituted with two positively charged moieties, M is Pb; and X is Cl. In some embodiments, the organic cation is a $C_1$-$C_{20}$ hydrocarbyl or $C_6$-$C_{20}$ aryl substituted with two positively charged moieties, M is Pb; and X is Br. In some embodiments, the organic cation is a $C_1$-$C_{20}$ hydrocarbyl or $C_6$-$C_{20}$ aryl substituted with two positively charged moieties, M is Pb; and X is I.

In some embodiments of the metal halide perovskite having a unit cell according to formula (I), the organic cation is a $C_1$-$C_{20}$ hydrocarbyl or $C_6$-$C_{20}$ aryl substituted with at least one of a primary ammonium cation, a secondary ammonium cation, and a tertiary ammonium cation; M is Sn, Cu, Ge, Mn, Co, Pb, Bi, Sb, or Eu; and X is Cl, Br, or I. In some embodiments, the organic cation is a $C_1$-$C_{20}$ hydrocarbyl or $C_6$-$C_{20}$ aryl substituted with at least one of a primary ammonium cation, a secondary ammonium cation, and a tertiary ammonium cation, M is Pb; X is Cl, Br or I. In some embodiments, the organic cation is a $C_1$-$C_{20}$ hydrocarbyl or $C_6$-$C_{20}$ aryl substituted with at least one of a primary ammonium cation, a secondary ammonium cation, and a tertiary ammonium cation, M is Pb; and X is Cl. In some embodiments, the organic cation is a $C_1$-$C_{20}$ hydrocarbyl or $C_6$-$C_{20}$ aryl substituted with at least one of a primary ammonium cation, a secondary ammonium cation, and a tertiary ammonium cation, M is Pb; and X is Br. In some embodiments, the organic cation is a $C_1$-$C_{20}$ hydrocarbyl or $C_6$-$C_{20}$ aryl substituted with at least one of a primary ammonium cation, a secondary ammonium cation, and a tertiary ammonium cation, M is Pb; and X is I.

In some embodiments of the metal halide perovskite having a unit cell according to formula (I), the organic cation is a $C_1$-$C_{20}$ hydrocarbyl or $C_6$-$C_{20}$ aryl substituted with two secondary ammonium cations; M is Sn, Cu, Ge, Mn, Co, Pb, Bi, Sb, or Eu; and X is Cl, Br, or I. In some embodiments, the organic cation is a $C_1$-$C_{20}$ hydrocarbyl or $C_6$-$C_{20}$ aryl substituted with two secondary ammonium cations, M is Pb; X is Cl, Br or I. In some embodiments, the organic cation is a $C_1$-$C_{20}$ hydrocarbyl or $C_6$-$C_{20}$ aryl substituted with two secondary ammonium cations, M is Pb; and X is Cl. In some embodiments, the organic cation is a $C_1$-$C_{20}$ hydrocarbyl or $C_6$-$C_{20}$ aryl substituted with two secondary ammonium cations, M is Pb; and X is Br. In some embodiments, the organic cation is a $C_1$-$C_{20}$ hydrocarbyl or $C_6$-$C_{20}$ aryl substituted with two secondary ammonium cations, M is Pb; and X is I.

In some embodiments of the metal halide perovskite having a unit cell according to formula (I), the organic cation is a $C_1$-$C_{20}$ hydrocarbyl or $C_6$-$C_{20}$ aryl substituted with three secondary ammonium cations; M is Sn, Cu, Ge, Mn, Co, Pb, Bi, Sb, or Eu; and X is Cl, Br, or I. In some embodiments, the organic cation is a $C_1$-$C_{20}$ hydrocarbyl or $C_6$-$C_{20}$ aryl substituted with three secondary ammonium cations, M is Pb; X is Cl, Br or I. In some embodiments, the organic cation is a $C_1$-$C_{20}$ hydrocarbyl or $C_6$-$C_{20}$ aryl substituted with three secondary ammonium cations, M is Pb; and X is Cl. In some embodiments, the organic cation is a $C_1$-$C_{20}$ hydrocarbyl or $C_6$-$C_{20}$ aryl substituted with three secondary ammonium cations, M is Pb; and X is Br. In some embodiments, the organic cation is a $C_1$-$C_{20}$ hydrocarbyl or $C_6$-$C_{20}$ aryl substituted with three secondary ammonium cations, M is Pb; and X is I.

In some embodiments of the metal halide perovskite having a unit cell according to formula (I), the organic cation is a $C_1$-$C_{20}$ hydrocarbyl or $C_6$-$C_{20}$ aryl substituted with four secondary ammonium cations; M is Sn, Cu, Ge, Mn, Co, Pb, Bi, Sb, or Eu; and X is Cl, Br, or I. In some embodiments, the organic cation is a $C_1$-$C_{20}$ hydrocarbyl or $C_6$-$C_{20}$ aryl substituted with four secondary ammonium cations, M is Pb; X is Cl, Br or I. In some embodiments, the organic cation is a $C_1$-$C_{20}$ hydrocarbyl or $C_6$-$C_{20}$ aryl substituted with four secondary ammonium cations, M is Pb; and X is Cl. In some embodiments, the organic cation is a $C_1$-$C_{20}$ hydrocarbyl or $C_6$-$C_{20}$ aryl substituted with four secondary ammonium cations, M is Pb; and X is Br. In some embodiments, the organic cation is a $C_1$-$C_{20}$ hydrocarbyl or $C_6$-$C_{20}$ aryl substituted with four secondary ammonium cations, M is Pb; and X is I.

In one embodiment, the organic cation is a compound according to the following formula (A):

(A)

wherein each of $R_1$-$R_6$ is independently selected from hydrogen or a monovalent $C_1$-$C_{20}$ hydrocarbyl, and $R_7$ is a divalent $C_1$-$C_{20}$ hydrocarbyl or $C_6$-$C_{20}$ aryl. In some embodiments, $R_7$ is a divalent, unsubstituted $C_1$-$C_4$ hydrocarbyl, and the organic cation is a compound according to the following formula (B):

(B)

In some embodiments, $R_7$ is a divalent, unsubstituted $C_1$-$C_4$ hydrocarbyl, each of $R_2$, $R_3$, $R_5$, and $R_6$ is hydrogen, and the organic cation is a compound according to the following formula (C):

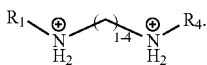

(C)

In a still further embodiment, $R_7$ is a divalent, unsubstituted $C_1$-$C_4$ hydrocarbyl, each of $R_2$, $R_3$, $R_5$, and $R_6$ is hydrogen, each of $R_1$ and $R_4$ is independently a monovalent, unsubstituted $C_1$-$C_3$ hydrocarbyl, and the organic cation is a compound according to the following formula (D):

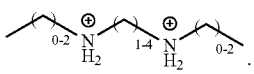

(D)

In a particular embodiment, $R_7$ is a divalent, unsubstituted $C_6$ aryl, and the organic cation is a compound according to the following formula (E), which may be ortho-, meta-, or para-substituted:

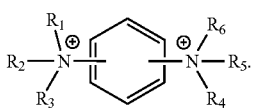

(E)

In some embodiments, $R_7$ is a divalent, unsubstituted $C_6$ aryl, each of $R_2$, $R_3$, $R_5$, and $R_6$ are hydrogen, and the organic cation is a compound according to the following formula (F):

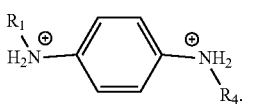

(F)

In a still further embodiment, $R_7$ is a divalent, unsubstituted $C_6$ aryl, each of $R_2$, $R_3$, $R_5$, and $R_6$ is hydrogen, each of $R_1$ and $R_4$ is independently a monovalent, unsubstituted $C_1$-$C_3$ hydrocarbyl, and the organic cation is a compound according to the following formula (G):

(G)

In one embodiment, the organic cation is a compound according to the following formula (H):

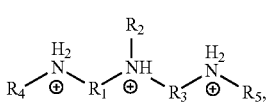

(H)

wherein each of $R_1$ and $R_3$ is independently selected from a divalent $C_1$-$C_{20}$ hydrocarbyl, and each of $R_2$, $R_4$, and $R_5$ is independently selected from hydrogen or a monovalent $C_1$-$C_{20}$ hydrocarbyl. In some embodiments, $R_2$ is hydrogen, $R_4$ and $R_5$ are independently monovalent, unsubstituted $C_1$-$C_3$ hydrocarbyls, and $R_1$ and $R_3$ are independently divalent, unsubstituted $C_2$-$C_4$ hydrocarbyls, and the organic cation is a compound according to the following formula (I):

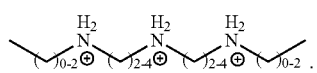

(I)

In some embodiments, $R_2$ is a divalent, substituted $C_2$-$C_4$ hydrocarbyl, wherein the substituent is a secondary amine, $R_4$ and $R_5$ are independently monovalent, unsubstituted $C_1$-$C_3$ hydrocarbyls, and $R_1$ and $R_3$ are independently divalent, unsubstituted $C_2$-$C_4$ hydrocarbyls, and the organic cation is a compound according to the following formula (J):

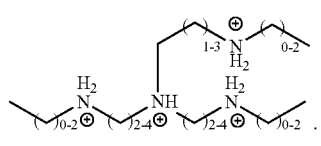

(J)

In one embodiment, the organic cation is a compound according to the following formula (K):

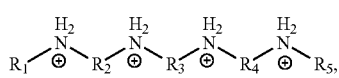

(K)

wherein $R_1$ and $R_5$ are independently selected from a monovalent $C_1$-$C_{20}$ hydrocarbyl or hydrogen, $R_2$ and $R_4$ are independently selected from a divalent $C_1$-$C_{20}$ hydrocarbyl, and $R_3$ is a divalent $C_1$-$C_{20}$ hydrocarbyl or a divalent $C_6$-$C_{20}$ aryl. In a particular embodiment, $R_1$ and $R_5$ independently are unsubstituted, monovalent $C_1$-$C_3$ hydrocarbyls, $R_2$, $R_3$, and $R_4$ are independently unsubstituted, divalent $C_2$-$C_4$ hydrocarbyls, and the organic cation has a structure according to the following formula (L):

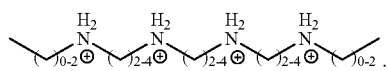

(L)

In one embodiment, the organic cation is a compound according to the following formula (M):

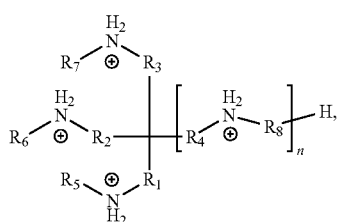

(M)

wherein n is 0 or 1, each of $R_1$-$R_4$ and $R_8$ is independently selected from a divalent $C_1$-$C_{20}$ hydrocarbyl, and each of $R_5$-$R_7$ is independently selected from a monovalent $C_1$-$C_{20}$ hydrocarbyl or hydrogen. In a particular embodiment, n is 1, $R_1$-$R_4$ independently are unsubstituted, divalent $C_1$-$C_4$ hydrocarbyls, $R_8$ is an unsubstituted, divalent $C_1$-$C_3$ hydrocarbyl, and $R_5$-$R_7$ independently are unsubstituted, monovalent $C_1$-$C_3$ hydrocarbyls, and the organic cation is a compound according to the following formula (N): (N).

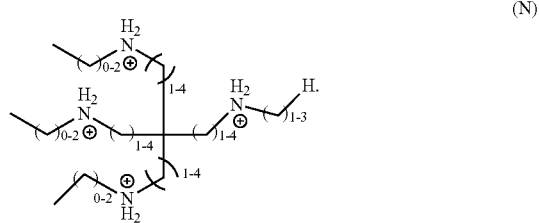

In some embodiments, n is 0, $R_1$-$R_3$ are unsubstituted, divalent $C_1$-$C_4$ hydrocarbyls, and $R_5$-$R_7$ are unsubstituted, monovalent $C_1$-$C_3$ hydrocarbyls, and the organic cation is a compound according to the following formula (O):

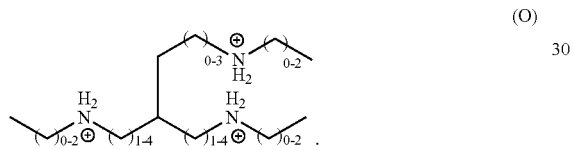

In one embodiment, the organic cation is a compound according to the following formula (P):

wherein m is 0 or 1, n is 1-4, each $R_1$ is independently selected from a divalent $C_1$-$C_{20}$ hydrocarbyl, and each $R_2$ is independently selected from a monovalent $C_1$-$C_{20}$ hydrocarbyl or hydrogen. In a particular embodiment, m is 0, n is 3, and $R_2$ is an unsubstituted, monovalent $C_1$-$C_3$ hydrocarbyl, and the organic cation is a compound according to the following formula (Q):

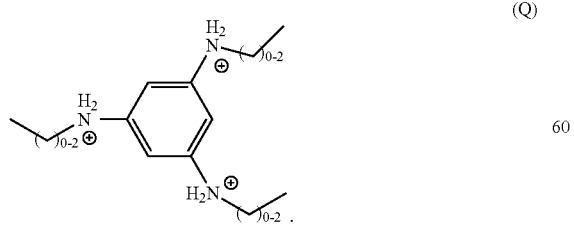

In some embodiments of the metal halide perovskite having a unit cell according to formula (I), the organic cation is selected from a compound of formula (A), (B), (C), (D), (E), (F), (G), (H), (I), (J), (K), (L), (M), (N), (O), (P), (Q), or a combination thereof; M is Sn, Cu, Ge, Mn, Co, Pb, Bi, Sb, or Eu; and X is Cl, Br or I. In some embodiments, the organic cation is selected from a compound of formula (A), (B), (C), (D), (E), (F), (G), (H), (I), (J), (K), (L), (M), (N), (O), (P), (Q), or a combination thereof; M is Pb; and X is Cl, Br, or I. In some embodiments, the organic cation is selected from a compound of formula (A), (B), (C), (D), (E), (F), (G), (H), (I), (J), (K), (L), (M), (N), (O), (P), (Q), or a combination thereof; M is Pb; and X is Cl. In some embodiments, the organic cation is selected from a compound of formula (A), (B), (C), (D), (E), (F), (G), (H), (I), (J), (K), (L), (M), (N), (O), (P), (Q), or a combination thereof; M is Pb; and X is Br. In some embodiments, the organic cation is selected from a compound of formula (A), (B), (C), (D), (E), (F), (G), (H), (I), (J), (K), (L), (M), (N), (O), (P), (Q), or a combination thereof; M is Pb; and X is I.

In one embodiment, the organic cation is selected from a compound according to structures (1)-(10):

(1)

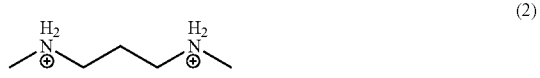
(2)

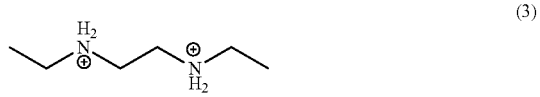
(3)

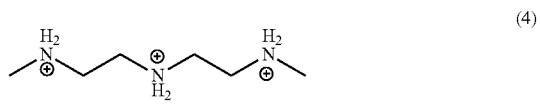
(4)

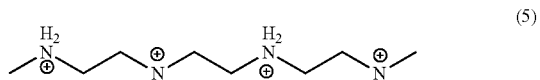
(5)

(6)

(7)

(8)

(9)

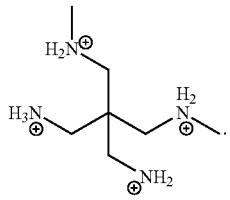

(10)

In some embodiments of the metal halide perovskites having a unit cell according to formula (I), the organic cation is selected from compound (1), (2), (3), (4), (5), (6), (7), (8), (9), (10), or a combination thereof; M is Sn, Cu, Ge, Mn, Co, Pb, Bi, Sb, or Eu; and X is Cl, Br, or I. In some embodiments, the organic cation is selected from compound (1), (2), (3), (4), (5), (6), (7), (8), (9), (10), or a combination thereof; M is Pb; and X is Cl, Br, or I. In some embodiments, the organic cation is selected from compound (1), (2), (3), (4), (5), (6), (7), (8), (9), (10), or a combination thereof; M is Sn; and X is Cl. In some embodiments, the organic cation is selected from compound (1), (2), (3), (4), (5), (6), (7), (8), (9), (10), or a combination thereof; M is Sn; and X is Br. In some embodiments, the organic cation is selected from compound (1), (2), (3), (4), (5), (6), (7), (8), (9), (10), or a combination thereof; M is Sn; and X is I.

In one embodiment, the organic cation is N,N'-dimethylethane-1,2-diammonium, which has the following structure:

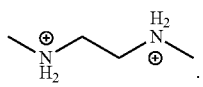

In some embodiments of the metal halide perovskite having a unit cell according to formula (I), the organic cation is N,N'-dimethylethane-1,2-diammonium; M is Sn, Cu, Ge, Mn, Co, Pb, Bi, Sb, or Eu; and X is Cl, Br, or I. In some embodiments, the organic cation is N,N'-dimethylethane-1,2-diammonium; M is Pb; and X is Cl, Br, or I. In some embodiments, the organic cation is N,N'-dimethylethane-1,2-diammonium; M is Sn; and X is Cl, and the unit cell has the following formula: $(C_4N_2H_{14})PbCl_4$. In some embodiments, the organic cation is N,N'-dimethylethane-1,2-diammonium; M is Sn; and X is Br, and the unit cell has the following formula: $(C_4N_2H_{14})PbBr_4$. In some embodiments, the organic cation is N,N'-dimethylethane-1,2-diammonium; M is Sn; and X is I, and the unit cell has the following formula: $(C_4N_2H_{14})PbI_4$.

Crystal Size

In some embodiments, the metal halide perovskites provided herein are bulk crystals. As used herein, the phrases "bulk crystals" or "bulk crystalline form" generally refer to crystals having at least one dimension that is 500 μm or greater. In some embodiments, the organic-inorganic hybrid perovskites provided herein are substantially needle-shaped. The needle-shaped organic-inorganic hybrid perovskites may have an average length of from about 2 mm to about 10 cm, from about 2 mm to about 5 cm, from about 2 mm to about 3 cm, from about 2 mm to about 1 cm, from about 5 mm to about 1 cm, or from about 6 mm to about 1 cm. In one embodiment, the bulk processes provided herein produce needle-shaped organic-inorganic hybrid perovskites.

In some embodiments, the metal halide perovskites provided herein are micro crystals. As used herein, the phrases "micro crystals" or "microsize crystals" may generally refer to crystals having an average largest dimension of about 15 μm to about 100 μm, as determined by scanning electron microscopy (SEM). In one embodiment, the micro crystals have an average largest dimension of about 15 μm to about 50 μm. The micro crystals may be a powder. In some embodiments, the organic-inorganic hybrid perovskites are microscale crystals that are substantially hexagonal in shape. The substantially hexagonal crystals may have an average lateral dimension of from about 0.1 to about 3 μm, from about 0.2 to about 2.5 μm, from about 0.3 to about 2.2 μm, from about 0.4 to about 2.1 μm, or from about 0.5 to about 2 μm. The substantially hexagonal crystals may have an average thickness of from about 0.5 to about 2 μm, from about 0.8 to about 1.8 μm, from about 0.9 to about 1.7 μm, or from about 1 to about 1.5 μm. In one embodiment, the microscale processes provided herein produce substantially hexagonal perovskite crystals.

Devices

Provided herein are devices that include one or more metal halide perovskites. The metal halide perovskites provided herein, in some embodiments, are light emitting materials in the devices. The metal halide perovskites may emit light that is white, blue, green, yellow, orange, or red. Not wishing to be bound by any particular theory, it is believed that the color emitted by the metal halide perovskites provided herein can be changed or tuned by changing the metal atom, the halide ion, the organic cation, or a combination thereof.

In some embodiments, the devices include at least two metal halide perovskites that emit light of different colors. For example, the devices may include a first metal halide perovskite that emits blue light, and a second metal halide perovskite that emits red light. As a further example, the devices may include a first metal halide perovskite that emits blue light, a second metal halide perovskite that emits red light, and a third metal halide perovskite that emits green light. In certain some embodiments, the devices herein include full color displays. The full color display may be provided by two or more metal halide perovskites that emit light of different colors; or, alternatively, the full color display may be provided by a combination of one or more metal halide perovskites and one or more other materials, each of the materials and one or more metal halide perovskites emitting different colors of light.

The devices may include optoelectronic devices, such as a photovoltaic cell, a light emitting diode, a light emitting electrochemical cell, a photodetector, and an optically pumped laser. In some embodiments, the devices provided herein are solid-state lighting devices.

In some embodiments, the light emitting diodes include an anode, a cathode, and a light emitting layer. The light emitting diodes also may include at least one of an electron transport layer and a hole transport layer. The anode may include indium tin oxide (ITO). The cathode may include LiF/Al. In particular embodiments, the light emitting diodes may further include at least one of a hole injection layer, an electron injection layer, a hole blocking layer, and an electron blocking layer. In one embodiment, the light emitting layer includes at least one of the metal halide perovskites having a 1D crystal structure including a unit cell according to formula (I).

Methods

Methods are provided herein for making metal halide perovskites. The methods may be used to produce bulk and/or microsize crystals of the metal halide perovskites, which may have a 1D structure, as described herein.

In some embodiments, the methods include providing a liquid formulation that includes (i) a metal halide, (ii) an organic ligand, (iii) an organic acid, and (iv) a liquid hydrocarbon; and agitating the liquid formulation to form a metal halide perovskite having a 1D crystal structure. The agitating generally may include any form of agitation, including, but not limited to, stirring, shaking, sonicating, or a combination thereof. The metal halide may include a metal chloride, metal bromide, metal iodide, or a combination thereof, and the metal of the metal halide may be any metal from which "M" of formula (I) herein may be selected. For example, the metal halide may be lead (II) chloride, lead (II) bromide, lead (II) iodide, or a combination thereof. The organic acid generally may include a $C_1$-$C_{20}$ hydrocarbyl substituted with at least one carboxylic acid functional group. In some embodiments, the organic acid is a $C_4$-$C_{12}$ hydrocarbyl substituted at the 1-position with a carboxylic acid functional group. In some embodiments, the organic acid is octanoic acid. The liquid hydrocarbon generally may include any substituted or unsubstituted $C_1$-$C_{20}$ hydrocarbyl that is a liquid at the conditions at which the method is performed. In some embodiments, the liquid hydrocarbon includes an unsubstituted $C_4$-$C_{10}$ hydrocarbyl. In some embodiments, the liquid hydrocarbon is hexane. In some embodiments, the methods also include centrifuging the liquid formulation to isolate the metal halide perovskite having a 1D crystal structure. Other known separation techniques, however, may be used instead of, or in combination with, the centrifuging. The metal halide and the organic ligand generally may be present at any amounts effective to form a metal halide perovskite having a 1D structure, as described herein. In some embodiments, the organic acid is present at an amount effective to convert the organic ligand to an organic cation. The organic ligand may have any structure effective to form an organic cation provided herein, including organic cations that include at least one secondary ammonium cation, at least one tertiary ammonium cation, or a combination thereof.

In some embodiments, the methods of forming a metal halide perovskite include providing an aqueous formulation that includes (i) a metal halide, (ii) an organic ligand, and (iii) a hydrogen halide; and contacting the aqueous formulation with a precipitant to form a metal halide perovskite having a 1D crystal structure. The metal halide may include a metal chloride, metal bromide, metal iodide, or a combination thereof, and the metal of the metal halide may be any metal from which "M" of formula (I) herein may be selected. For example, the metal halide may be lead (II) chloride, lead (II) bromide, lead (II) iodide, or a combination thereof. The organic ligand may have any structure effective to form an organic cation provided herein, including organic cations that include at least one secondary ammonium cation, at least one tertiary ammonium cation, or a combination thereof. The metal halide and the organic ligand generally may be present at any amounts effective to form a metal halide perovskite having a 1D structure, as described herein. The hydrogen halide may have a formula HX, wherein X is a halogen. The halogen may be Cl, Br, or I; therefore, the hydrogen halide may be HCl, HBr, HI, or any combination thereof. In some embodiments, the hydrogen halide is present at an amount effective to convert the organic ligand to an organic cation. In some embodiments, the contacting of the aqueous formulation with the precipitant includes diffusing the precipitant into the aqueous formulation. For example, a vapor diffusion chamber may be used to diffuse the precipitant into an aqueous formulation. The precipitant may be any liquid capable of facilitating crystallization. In some embodiments, the precipitant is acetone. Other liquids and precipitants are envisioned. The precipitant may be added at room temperature. The precipitant may be added over a period of about 5 to about 12 hours.

Methods also are provided for making a doped metal halide perovskite. A dopant may be added to the aqueous formulation or liquid formulation of the methods provided herein. In some embodiments, a method of making a doped metal halide perovskite includes providing a precursor formulation that includes (i) a metal halide, (ii) an organic cation, (iii) a manganese halide, and (iv) a liquid; and contacting the precursor formulation with a precipitant to form a doped metal halide perovskite. The liquid generally may be any liquid capable of facilitating crystal formation, especially upon addition of the precipitant. In some embodiments, the liquid is a polar organic solvent, such as dimethylformamide (DMF), dimethyl sulfoxide (DMSO), γ-butyrolactone (GBL). In some embodiments, the liquid is DMSO. The metal halide may include a metal chloride, metal bromide, metal iodide, or a combination thereof, and the metal of the metal halide may be any metal from which "M" of formula (I) herein may be selected. For example, the metal halide may be lead (II) chloride, lead (II) bromide, lead (II) iodide, or a combination thereof. The organic cation may be an organic cation, as disclosed herein, and may be added to the precursor formulation as a halide salt. For example, the organic cation halide salt may be a halide salt of any of formulas (A)-(Q) or (1)-(10). In some embodiments, the organic ligand halide salt is N,N'-dimethylethane-1,2-diammonium chloride, N,N'-dimethylethane-1,2-diammonium bromide, or N,N'-dimethylethane-1,2-diammonium iodide. The metal halide and the organic cation generally may be present at any amounts effective to form a metal halide perovskite having a 1D structure, as described herein. The manganese halide generally may be present in the precursor formulation in any amount effective to achieve a desired dopant concentration in the metal halide perovskite. In some embodiments, the mol ratio of the metal halide to the manganese halide in the precursor formulation is about 8:1 to about 1:1. The precipitant may be any liquid capable of facilitating crystallization. In some embodiments, the precipitant is acetone. Other liquids and precipitants are envisioned. In some embodiments, the contacting of the precursor formulation with a precipitant includes adding the precursor solution to the precipitant with stirring. The stirring may last about 1 minute to about 30 minutes. The precipitant may be added at room temperature.

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

The present disclosure may address one or more of the problems and deficiencies of known methods and processes. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

In the descriptions provided herein, the terms "includes," "is," "containing," "having," and "comprises" are used in an open-ended fashion, and thus should be interpreted to mean "including, but not limited to." When methods and composite materials are claimed or described in terms of "comprising" various components or steps, the composite materials and methods can also "consist essentially of" or "consist of" the various components or steps, unless stated otherwise.

The terms "a," "an," and "the" are intended to include plural alternatives, e.g., at least one. For instance, the disclosure of "a polymer," "a liquid," "an all-inorganic perovskite", and the like, is meant to encompass one, or mixtures or combinations of more than one polymer, liquid, all-inorganic perovskite, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in some embodiments, that the precipitant may be added over a period of about 5 hours to about 12 hours. This range should be interpreted as encompassing periods of about 5 hours to about 12 hours, and further encompasses "about" each of 6 hours, 7 hours, 8 hours, 9 hours, 10 hours, and 11 hours, including any ranges and sub-ranges between any of these values.

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

EXAMPLES

Unless stated otherwise, the following materials were used in the examples. Lead (II) chloride (99.999%), lead (II) bromide (99.999%), lead (II) iodide (99.999%), Manganese (II) bromide (98%), N,N'-dimethylethylenediamine (99%), hydrochloric acid (37 wt. % in $H_2O$), hydrobromic acid (48 wt. % in $H_2O$), hydroiodic acid (57 wt. % in $H_2O$) were purchased from Sigma-Aldrich. Dimethyl Sulfoxide (DMSO, >99.8%, anhydrous) was purchased from Honeywell Research Chemicals. Acetone (HPLC grade) was purchased from EMD Millipore. All reagents and solvents were used without further purification unless otherwise stated. Spectroscopic grade solvents were used in the UV-vis and photoluminescence spectroscopic measurements.

Example 1—Synthesis of 1D Lead (II) Bromide Perovskites

Lead(II) bromide (99.999%), N,N'-dimethylethylenediamine (99%), hydrobromic acid (48 wt. % in $H_2O$), octanoic acid (98%) and hexane (98.5%, mixture of isomers) were purchased from Sigma-Aldrich. All reagents and solvents were used without further purification unless otherwise stated. Spectroscopic grade solvents were used in the UV-Vis and photoluminescence spectroscopic measurements.

The following methods demonstrated that the single crystalline 1D lead bromide perovskites were synthesized by wet chemistry methods with high yield and excellent reproducibility.

1. Growth of $C_4N_2H_{14}PbBr_4$ bulk single crystals

Lead(II) bromide (0.100 g, 0.27 mmol) and N,N'-dimethylethylenediamine (0.024 g, 0.27 mmol) were combined in 10 mL of 48 wt. % hydrobromic acid and sonicated for 10 minutes to obtain a clear solution. 1 mL of the stock solution was set up in vapor diffusion chambers with acetone. Colorless needle-like crystals of $C_4N_2H_{14}PbBr_4$ were obtained through diffusion of acetone into this solution over a 24 h period. The crystals suitable for X-ray structure determination were washed with acetone, and dried under reduced pressure to afford 0.010 g (yield of ~60%) of product.

The synthesis of 1D single crystal perovskites was conducted in HBr aqueous solution at room temperature in this example. $PbBr_2$ and N, N'-dimethylethylenediamine (DMEDA) were fully dissolved in the hydrobromic acid solution to afford the 1D perovskite single crystals, i.e. $(DMEDA)PbBr_4$.

It should be noted that it is believed that the preparation of organic ammonium bromide salts is not necessary in this synthesis because hydrobromic acid can protonate DMEDA and enhance the solubility of $PbBr_2$ in aqueous solution.

The as-prepared 1D single crystal perovskites had a needle-like shape, with a long axis from several millimeters to several centimeters.

2. Synthesis of $C_4N_2H_{14}PbBr_4$ Microscale 1D Perovskites 0.1 mmol Lead(II) bromide (36.7 mg) was added in 5 mL hexane solution with 1.0 mmol octanoic acid (160 μL), followed by injecting 0.3 mmol N,N'-dimethylethylenediamine (32 μL) to form a turbid solution. The reaction solution was vigorously stirred at room temperature for 30 min until a white colloidal solution was formed and the white microscale perovskites were obtained by centrifugation to remove the unreactive materials in the clear supernatant, affording a white powder in a yield of ~95% after dried under vacuum.

Not wishing to be bound by any particular theory, it was believed that the relatively short reaction time in one-pot synthesis suspended the extended crystallization along the metal halide chain direction.

In this example, a polar-solvent-free approach was adopted to prepare microscale 1D lead bromide perovskites at room temperature. $PbBr_2$ was added into a hexane solution containing octanoic acid, followed by injection with N,N'-dimethylethylenediamine to form a turbid solution.

It is believed that octanoic acid protonated the bisamine ligand, solubilized $PbBr_2$, and colloidally stabilized the generated microscale perovskites. The 1D microscale perovskites were produced as a white colloidal solution within 30 min in a high yield of ~95%. Centrifugation was then applied to remove the unreacted starting materials and byproducts, and afforded the desired halide perovskite, which was dispersible in common non-polar organic solvents, such as toluene, to form a stable colloidal solution.

Example 2—Characterization of the 1D Lead (II) Bromide Perovskites

The structure and composition of the hybrid perovskites of Example 1 were characterized using Single Crystal X-ray Diffraction (SCXRD), Powder X-Ray Diffraction (PXRD), Transmission Electron Microscopy (TEM), Atomic Force Microscopy (AFM), Proton Nuclear Magnetic Resonance (1H NMR), and Thermogravimetric Analysis (TGA). The photophysical properties of the hybrid perovskites were analyzed via steady state and time-resolved photoluminescence spectroscopies.

1. Optical Imaging

Optical micrograph was obtained using an inverted Nikon Ti epifluorescence microscope equipped with an Andor iXonEM+ 885 EMCCD camera. In optical microscopic images, the 1D bulk lead bromide perovskite crystals were needle-shaped.

Photo-images of the bulk perovskite crystals were taken under ambient light and UV (365 nm) irradiation respectively. The needle shaped crystals were colorless and showed strong bluish white-light emission upon UV irradiation.

Figure 2:
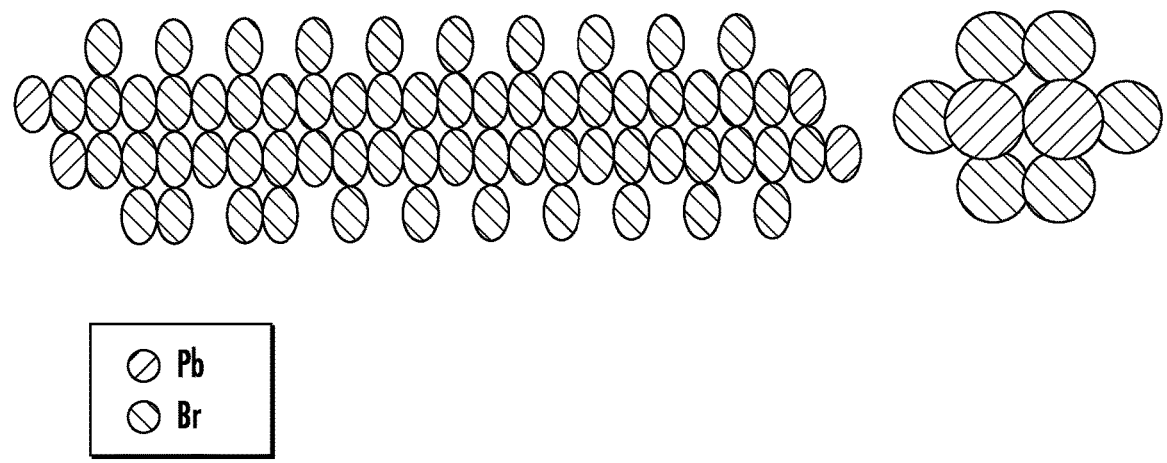
FIG. 2 depicts side and end view of an embodiment of an individual lead bromide quantum wire with edge sharing octahedron.

The 1D structure of the crystals included $[PbBr_4^{2-}]_\infty$ chains sitting in rhombic columnar cages composed of $C_4N_2H_{14}^{2+}$ cations. FIG. 1 depicts the 1D core-shell quantum wires, in which insulating organic shells wrap around the core lead bromide wires. The lead bromide wires of FIG. 1 were based on double edged-shared octahedral $PbBr_4^{2-}$ units (FIG. 2), which differ from the typical corner sharing octahedral $PbBr_4^{2-}$ units found in 2D and 3D metal halide perovskites (see, e.g., Z. Y. Cheng, et al., Crystengcomm 12, 2646-2662 (2010).) or mixed octahedral-trigonal prismatic $PbI_3$— units found in 1D hybrid lead iodides (S. Elleuch, et al., *Acta Crystallogr E* 63, M306-M308 (2007)).

2. Single Crystal X-Ray Diffraction (SCXRD)

A needle-shaped crystal was mounted on a nylon loop with the use of heavy oil. The sample was held at −170° C. for data collection. The data were taken on a Bruker SMART APEX II diffractometer using a detector distance of 6 cm. The number of frames taken was 2400 using 0.3 degree omega scans with either 20 or 30 seconds of frame collection time. Integration was performed using the program SAINT which is part of the Bruker suite of programs. Absorption corrections were made using SADABS. XPREP was used to obtain an indication of the space group and the structure was typically solved by direct methods and refined by SHELXTL. The non-hydrogen atoms were refined anisotropically. The single crystal X-ray diffraction data of 1D bulk single crystal perovskites and other data is provided by the following tables.

Single Crystal X-Ray Diffraction Data of 1D Bulk Single Crystal Perovskites of Example 1:

| | |
|---|---|
| Empirical formula | C4 H14 Br4 N2 Pb |
| Formula weight | 617.00 |
| Temperature | 103(2) K |
| Wavelength | 0.71073 Å |
| Crystal system | Orthorhombic |
| Space group | I m m a |
| Unit cell dimensions | a = 14.6230(16) Å α = 90°. |
| | b = 6.1041(7) Å β = 90°. |
| | c = 14.4070(16) Å γ = 90°. |
| Volume | 1286.0(2) Å$^3$ |
| Z | 4 |
| Density (calculated) | 3.187 Mg/m$^3$ |
| Absorption coefficient | 25.504 mm$^{-1}$ |
| F(000) | 1096 |
| Crystal size | 0.280 × 0.095 × 0.060 mm$^3$ |
| Theta range for data collection | 1.984 to 28.488°. |
| Index ranges | −18 <= h <= 19, −7 <= k <= 8, −19 <= l <= 19 |
| Reflections collected | 7142 |
| Independent reflections | 895 [R(int) = 0.0481 |
| Completeness to theta = 25.242° | 99.9% |
| Absorption correction | Empirical |
| Max. and min. transmission | 0.2163 and 0.07491 |
| Refinement method | Full-matrix least-squares on F$^2$ |
| Data/restraints/parameters | 895/0/39 |
| Goodness-of-fit on F$^2$ | 1.137 |
| Final R indices [I > 2sigma(I)] | R1 = 0.0182, wR2 = 0.0416 |
| R indices (all data) | R1 = 0.0185, wR2 = 0.0417 |
| Extinction coefficient | 0.00168(9) |
| Largest diff. peak and hole | 1.068 and −1.161 e•Å$^{-3}$ |

Atomic Coordinates (×10$^4$) and Equivalent Isotropic Displacement Parameters (Å$^2$×10$^3$) of 1D Bulk Single Crystal Perovskites.

| | x | y | z | U(eq) |
|---|---|---|---|---|
| Pb(1) | 10000 | 2500 | 1155(1) | 7(1) |
| Br(1) | 7953(1) | 2500 | 1031(1) | 11(1) |
| Br(2) | 10000 | 7500 | 1095(1) | 12(1) |
| Br(3) | 10000 | 2500 | 3130(1) | 14(1) |
| C(1) | 7030(3) | 7500 | 2269(3) | 14(1) |
| C(2) | 6221(3) | 7500 | 774(3) | 14(1) |
| N(1) | 7128(2) | 7500 | 1248(2) | 11(1) |

Bond Lengths [Å] and Angles [°] for 1D Bulk Single Crystal Perovskites.

| | |
|---|---|
| Pb(1)-Br(3) | 2.8457(6) |
| Pb(1)-Br(1)#1 | 2.9987(5) |
| Pb(1)-Br(1) | 2.9987(5) |
| Pb(1)-Br(2)#2 | 3.0533(4) |
| Pb(1)-Br(2) | 3.0533(3) |
| Br(2)-Pb(1)#3 | 3.0533(4) |
| C(1)-N(1) | 1.478(5) |
| C(1)-C(1)#4 | 1.528(8) |
| C(1)-H(1C) | 0.9900 |
| C(1)-H(2C) | 0.9900 |
| C(2)-N(1) | 1.492(5) |
| C(2)-H(3C) | 0.9819 |
| C(2)-H(4C) | 0.9819 |
| C(2)-H(5C) | 0.9819 |
| N(1)-H(2N) | 0.9900 |
| N(1)-H(1N) | 0.9900 |
| Br(3)-Pb(1)-Br(1)#1 | 93.414(8) |
| Br(3)-Pb(1)-Br(1) | 93.414(8) |
| Br(1)#1-Pb(1)-Br(1) | 173.172(16) |
| Br(3)-Pb(1)-Br(2)#2 | 91.638(9) |
| Br(1)#1-Pb(1)-Br(2)#2 | 89.902(1) |
| Br(1)-Pb(1)-Br(2)#2 | 89.902(1) |
| Br(3)-Pb(1)-Br(2) | 91.638(9) |
| Br(1)#1-Pb(1)-Br(2) | 89.902(1) |
| Br(1)-Pb(1)-Br(2) | 89.902(1) |
| Br(2)#2-Pb(1)-Br(2) | 176.724(19) |
| Pb(1)-Br(2)-Pb(1)#3 | 176.724(19) |
| N(1)-C(1)-C(1)#4 | 110.3(4) |
| N(1)-C(1)-H(1C) | 109.6 |
| C(1)#4-C(1)-H(1C) | 109.6 |
| N(1)-C(1)-H(2C) | 109.6 |
| C(1)#4-C(1)-H(2C) | 109.6 |
| H(1C)-C(1)-H(2C) | 108.1 |
| N(1)-C(2)-H(3C) | 109.7 |
| N(1)-C(2)-H(4C) | 109.7 |
| H(3C)-C(2)-H(4C) | 109.3 |
| N(1)-C(2)-H(5C) | 109.7 |
| H(3C)-C(2)-H(5C) | 109.3 |
| H(4C)-C(2)-H(5C) | 109.3 |
| C(1)-N(1)-C(2) | 111.6(3) |
| C(1)-N(1)-H(2N) | 109.3 |
| C(2)-N(1)-H(2N) | 109.3 |
| C(1)-N(1)-H(1N) | 109.3 |

-continued

| | |
|---|---|
| C(2)-N(1)-H(1N) | 109.3 |
| H(2N)-N(1)-H(1N) | 108.0 |

Symmetry transformations used to generate equivalent atoms:
1 −x + 2, −y + 1/2, z
2 x, y − 1, z
3 x, y + 1, z
4 −x + 3/2, −y + 3/2, −z + 1/2

Anisotropic Displacement Parameters ($Å^2 \times 10^3$) for 1D Bulk Single Crystal Perovskites. The Anisotropic Displacement Factor Exponent Takes the Form: $-2\pi^2[h^2a^{*2}U^{11} + \ldots + 2hka^*b^*U^{12}]$.

| | $U^{11}$ | $U^{22}$ | $U^{33}$ | $U^{23}$ | $U^{13}$ | $U^{12}$ |
|---|---|---|---|---|---|---|
| Pb(1) | 6(1) | 8(1) | 6(1) | 0 | 0 | 0 |
| Br(1) | 7(1) | 10(1) | 15(1) | 0 | −2(1) | 0 |
| Br(2) | 18(1) | 9(1) | 10(1) | 0 | 0 | 0 |
| Br(3) | 19(1) | 14(1) | 8(1) | 0 | 0 | 0 |
| C(1) | 14(2) | 15(2) | 14(2) | 0 | 6(2) | 0 |
| C(2) | 13(2) | 14(2) | 15(2) | 0 | 0(2) | 0 |
| N(1) | 11(2) | 12(2) | 10(2) | 0 | 4(1) | 0 |

Hydrogen Coordinates ($\times 10^4$) and Isotropic Displacement Parameters ($Å^2 \times 10^3$) for 1D Bulk Single Crystal Perovskites.

| | x | y | z | U(eq) |
|---|---|---|---|---|
| H(1C) | 6683 | 6187 | 2466 | 17 |
| H(2C) | 6683 | 8813 | 2466 | 17 |
| H(3C) | 6309 | 7316 | 105 | 21 |
| H(4C) | 5909 | 8893 | 894 | 21 |
| H(5C) | 5848 | 6291 | 1014 | 21 |
| H(2N) | 7478 | 6188 | 1054 | 13 |
| H(1N) | 7478 | 8812 | 1054 | 13 |

Torsion Angles [°] for 1D Bulk Single Crystal Perovskites.

| | |
|---|---|
| C(1)#4-C(1)-N(1)-C(2) | 180.000(1) |

Symmetry transformations used to generate equivalent atoms:
1 −x + 2, −y + 1/2, z
2 x, y − 1, z
3 x, y + 1, z
4 −x + 3/2, −y + 3/2, −z + 1/2

3. Powder X-Ray Diffraction (PXRD)

Figure 3:
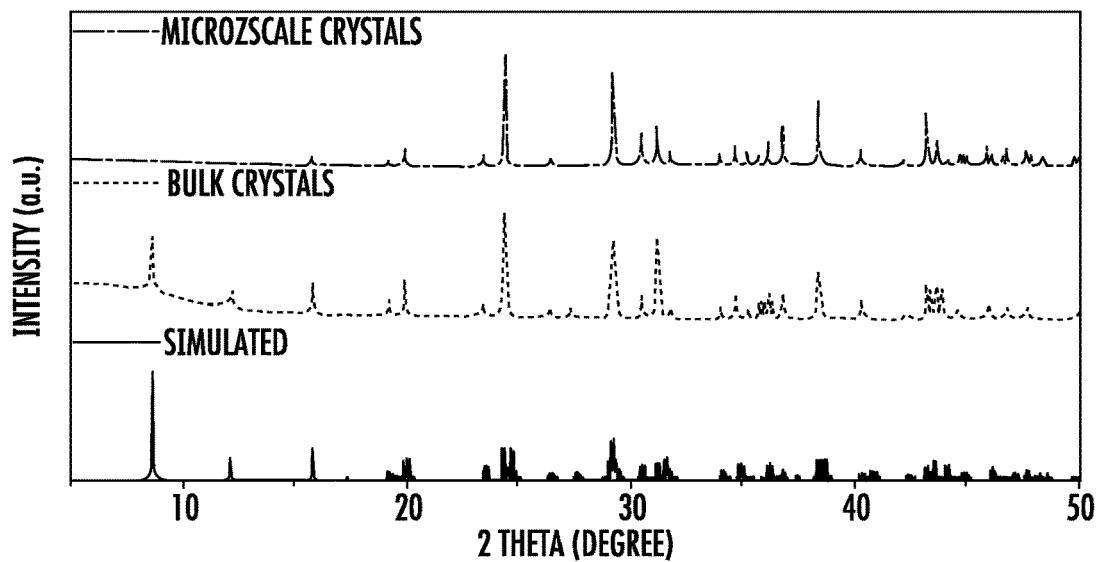
FIG. 3 depicts powder X-ray diffraction patterns of two embodiments of 1D perovskite crystals.

The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern was scanned over the angular range of 5-50 degree (2θ) with a step size of 0.02, at room temperature. Simulated powder patterns were calculated by Mercury software using the crystallographic information file (CIF) from single-crystal x-ray experiment. FIG. 3 depicts PXRD patterns of the bulk and microscale 1D perovskite crystals of Example 1, as well as the simulated PXRD patterns based on the single crystal structure. The PXRD patterns of the microscale crystals showed almost identical features as ball milled powders of bulk single crystals. All of these results demonstrated that the microscale perovskite crystals prepared by the one-pot synthesis provided herein possessed the same composition and crystal structure as the bulk single crystals prepared by solution growth, as provided herein.

4. Transmission Electron Microscopy Images (TEM)

Microstructural characterization was performed using transmission electron microscopy (TEM), on a JEOL JEM-ARM200cF at 200 kV. Low intensity illumination and fast acquisition time were used during data collection to avoid beam damage. TEM samples were prepared by depositing a few drops of the microscale perovskite solution on a carbon film supported copper grid (200 mesh); the samples were subsequently dried overnight. In an electron diffraction pattern along [210] zone axis of the microscale 1D perovskite crystals of Example 1, the d-spacings were determined as 7.20±0.1 Å for the (002) plane and 2.93±0.1 Å for the {121} plane, which was consistent with the values obtained from SCXRD for bulk crystals.

5. Atomic Force Microscopy Images (AFM)

AFM measurements were conducted using Bruker Icon. All measurements were performed in the standard tapping mode with OTESPA-R3 tips from Bruker.

Figure 4:
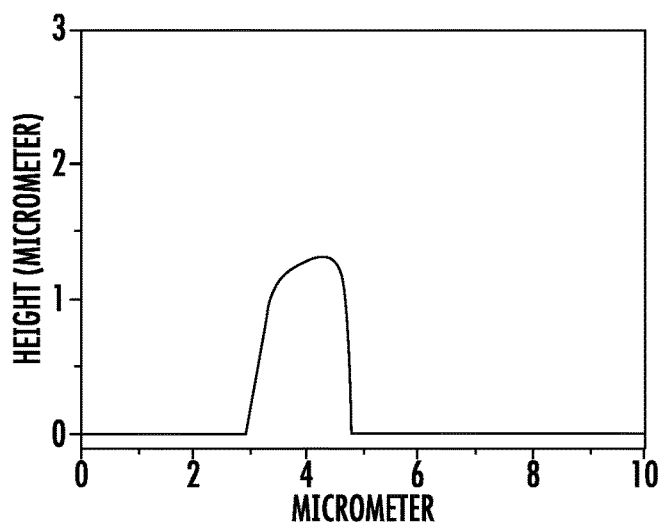
FIG. 4 depicts a height profile collected from a 2D Atomic Force Microscopy image of an embodiment of a 1D perovskite.
Figure 5:
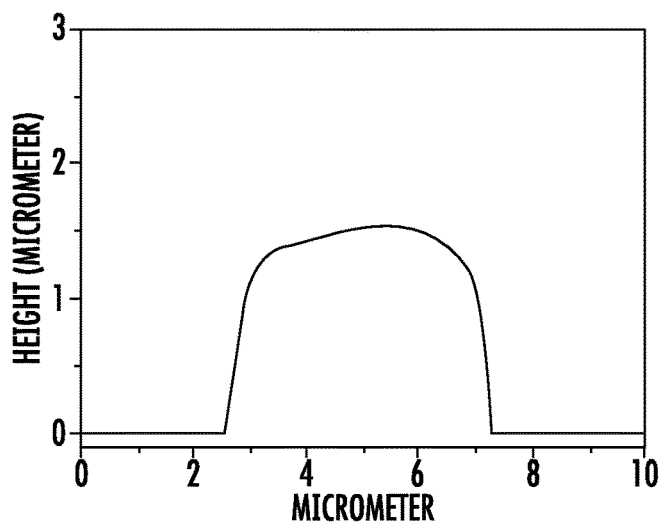
FIG. 5 depicts a height profile collected from a 2D Atomic Force Microscopy image of an embodiment of a 1D perovskite.

The thickness of the microscale perovskites of Example 1 was recorded with AFM. Drop-casting a diluted toluene solution of these microscale perovskites on a silicon wafer afforded individual pieces and small aggregates. The thickness of the individual microscale perovskites ranged from 1 to 1.5 micrometers as depicted at FIG. 4 and FIG. 5, which height profiles collected from 2D AFM images.

6. Proton Nuclear Magnetic Resonance ($^1$H-NMR)

$^1$H NMR spectra were acquired at room temperature on Bruker AVANCE III NMR Spectrometers with a 500 MHz Bruker magnet. All chemical shifts (δ) were reported in ppm relative to tetramethylsilane (TMS).

7. Thermogravimetry Analysis (TGA)

TGA was carried out using a TA instruments Q50 TGA system. The samples were heated from room temperature (~22° C.) to 800° C. with at a rate of 5° C.·min$^{-1}$, under a nitrogen flux of 100 mL·min$^{-1}$.

$^1$H NMR and TGA were applied to further verify the chemical composition of the microscale hybrid perovskites of Example 1. Only one set of peaks from N, N'-dimethylethylenediammonium cation was observed in proton NMR spectrum, suggesting that the octanoic acid had been completely removed from the products with the solvent. TGA analysis was also used to characterize the composition and purity of these microscale perovskites. Two major weight changes were observed: one corresponding to the loss of the organic bisammonium bromide of 41% at 310° C.; and the other related to the release of the inorganic lead bromide of 59% at 513° C. Based on these TGA results, the weight ratios between organic and inorganic salts were calculated to be 0.695, suggesting an approximately 1:1 molar ratio between the organic and inorganic components, which is consistent with 1D perovskite single crystal structure (FIG. 1 and FIG. 2), i.e. (DMEDA)PbBr$_4$.

Chemical Yield and Composition of the Component Molar Ratio in (DMEDA)PbBr$_4$ Microscale Perovskites According to TGA and $^1$H NMR Data.

| Product | Reagent | Starting amount | Molar ratio[a] | Theoretical ratio[b] | Yield |
|---|---|---|---|---|---|
| Microscale Perovskites | Octanoic Acid | 1.00 mmol | 0.00 | 0.00 | 95% |
| | DMEDA | 0.30 mmol | 1.02 | 1.00 | |
| | PbBr$_2$ | 0.10 mmol | 1.00 | 1.00 | |

[a]Based on $^1$H NMR and TGA data;
[b]based on the chemical formula: (DMEDA)PbBr$_4$.

Example 3—Photophysical Properties of the 1D Lead (II) Bromide Perovskites

The photophysical properties of the prepared bulk and microscale 1D lead bromide perovskites were investigated using the following techniques.

1. Absorption Spectrum Measurements

Absorption spectra of both bulk and microscale perovskite crystals were measured at room temperature through synchronous scan in an integrating sphere incorporated into the spectrofluorometer (FLS980, Edinburgh Instruments) while maintaining a 1 nm interval between the excitation and emission monochromators.

2. Photoluminescence Steady State Studies

Steady-state photoluminescence spectra of both bulk and microscale crystals in solid state were obtained at room temperature and 77 K (liquid nitrogen was used to cool the samples) on a Varian Cary Eclipse Fluorescence spectrophotometer.

3. Photoluminescence Quantum Yields (PLQEs)

For photoluminescence quantum yield measurement, the samples were excited using light output from a housed 450 W Xe lamp passed through a single grating (1800l/mm, 250 nm blaze) Czerny-Turner monochromator and finally a 5 nm bandwidth slit. Emission from the sample was passed through a single grating (1800 l/mm, 500 nm blaze) Czerny-Turner monochromator (5 nm bandwidth) and detected by a Peltier-cooled Hamamatsu R928 photomultiplier tube. The absolute quantum yields were acquired using an integrating sphere incorporated into the FLS980 spectrofluorometer.

4. Time-Resolved Photoluminescence

Time-Resolved Emission data were collected at room temperature and 77 K using the FLS980 spectrofluorometer. The dynamics of emission decay were monitored by using the FLS980's time-correlated single-photon counting capability (1024 channels; 1 μs window) with data collection for 10,000 counts. Excitation was provided by an Edinburgh EPL-360 picosecond pulsed diode laser. The average lifetime was obtained from the tri-exponential decays according to the equation 1.

$$\tau_{ave} = \Sigma\alpha_i\tau_i^2 / \Sigma\alpha_i\tau_i, i=1,2,3 \qquad (1)$$

where $\tau_i$ represents the decay time and $\alpha_i$ represents the amplitude of each component.

Figure 6:
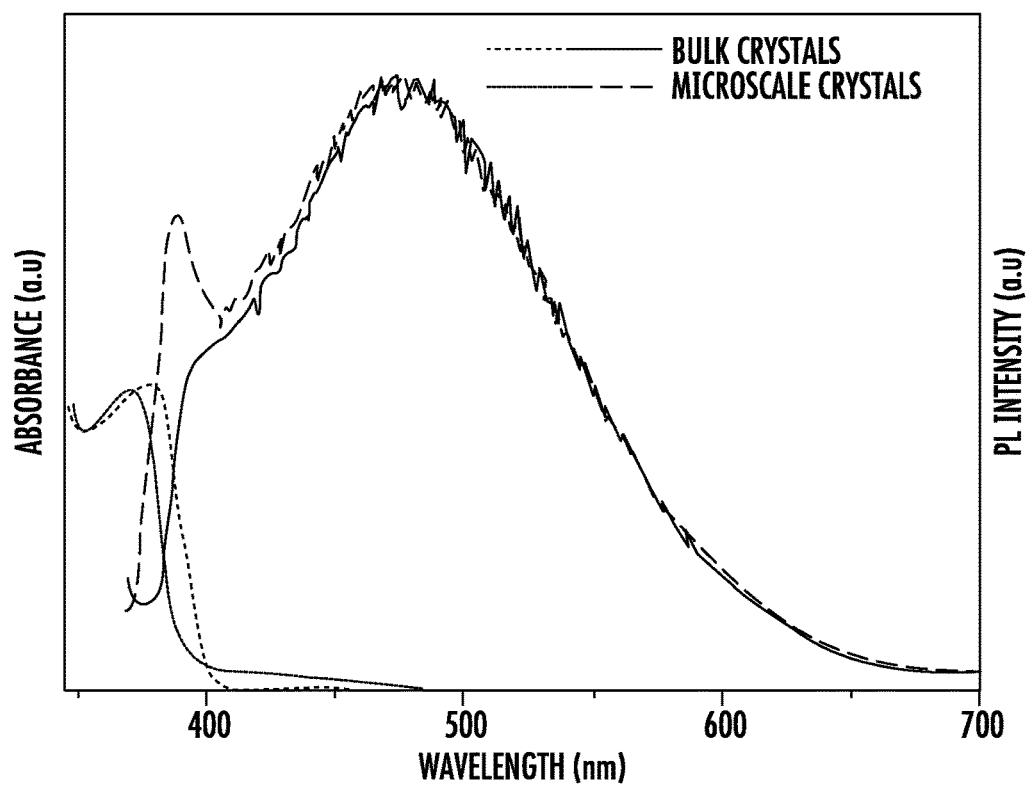
FIG. 6 depicts absorption (dot lines) and emission (solid lines) spectra of embodiments of bulk and microscale perovskite crystals at room temperature.

The absorption and emission spectra of the bulk and microscale crystals of Example 1 are shown in FIG. 6. High energy absorption with peaks at around 375 nm was observed for both bulk and microscale crystals. Upon excitation at 360 nm, both bulk and microscale crystals exhibited broad emissions, with a maximum at 475 nm and a large FWHM of 157 nm (0.90 eV), similar to the features of the corrugated 2D lead bromide perovskite (EDBE)[PbBr$_4$] (see E. R. Dohner, et al., *J Am Chem Soc* 136, 13154-13157 (2014)).

Figure 7:
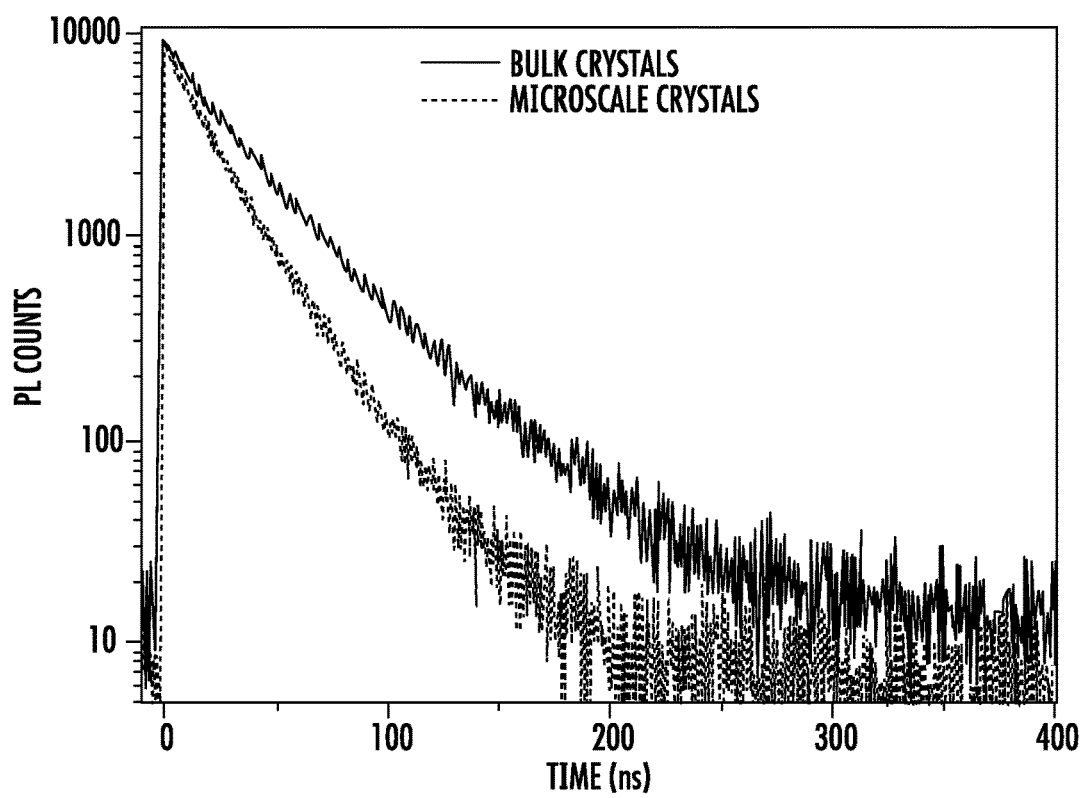
FIG. 7 depicts the decay of emissions from embodiments of bulk and microscale perovskite crystals at room temperature.

Blue shift of the absorption and emission spectra of the 1D perovskites of Example 1 as compared to corrugated 2D perovskites was believed to be due to the stronger quantum confinement in the 1D structure. FIG. 7 depicts the decay of emissions from the bulk and microscale crystals of Example 1 at room temperature, giving lifetimes of 37.3 and 26.6 ns respectively. In the microscale crystals, a well-defined emission peak at 389 nm was observed, which became much less intense in the bulk crystals. Not wishing to be bound by any particular theory, it was believed that this may have been attributed to the stronger self-absorption in bulk crystals. The slightly red-shifted absorption in the bulk crystals as compared to the microscale crystals also may have suggested stronger self-absorption at the band edge.

Figure 8:
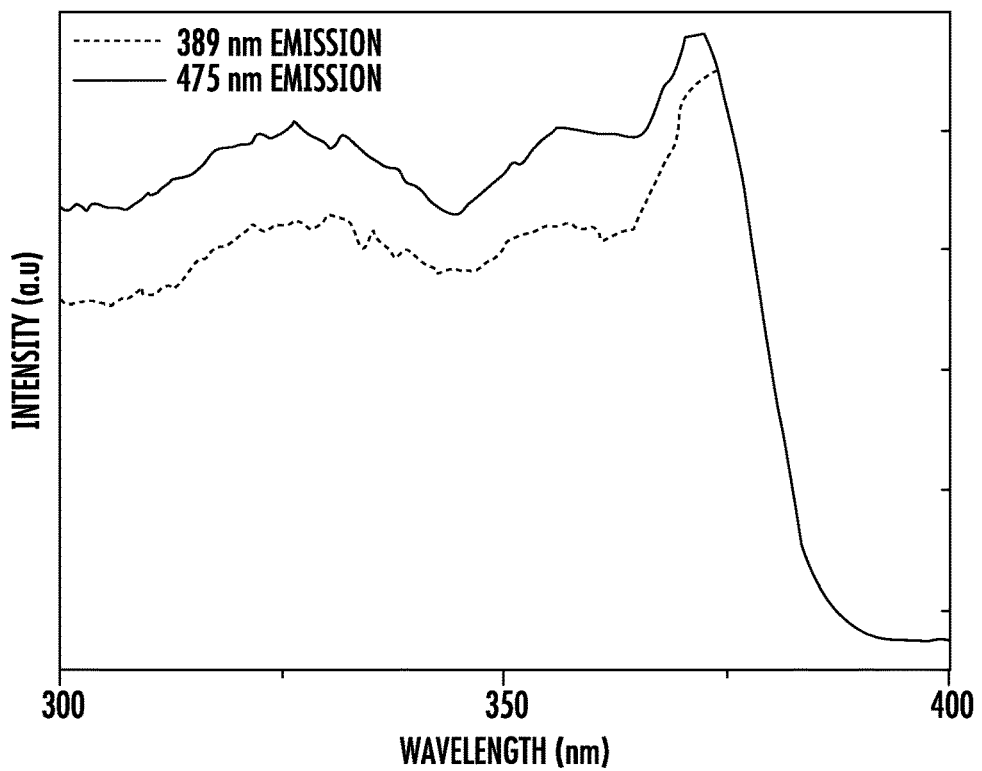
FIG. 8 depicts the excitation spectra for the 389 and 475 nm emissions of embodiments of 1D microscale perovskites.
Figure 9:
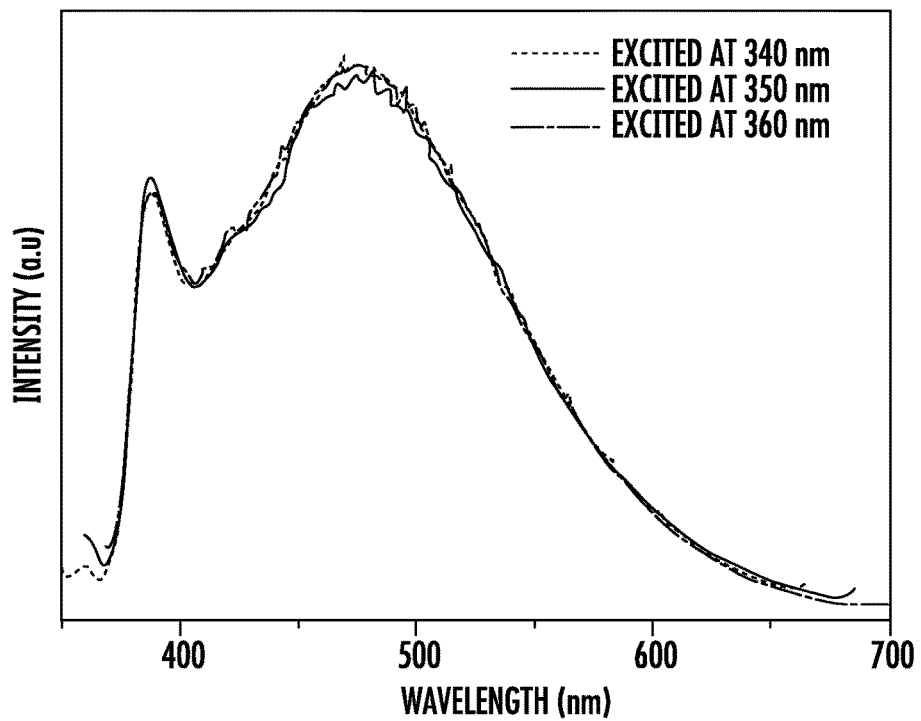
FIG. 9 depicts the emission spectra of embodiments of 1D microscale perovskites at different excitation wavelengths.

Considering the similarity of the photophysical properties between the 1D perovskites provided herein and the corrugated 2D perovskites, it was believed to be reasonable to assign the high energy narrow emission to the free excitons (direct band), and the low energy broad emission to the self-trapped excitons (indirect band). It was believed that the identical excitation spectra for peak emissions at 389 nm and 475 nm (FIG. 8), as well as the excitation independent emission spectra (excited at 340 nm, 350 nm and 360 nm) (FIG. 9) suggested that both the high energy narrow emission and the low energy broad emission originated from the same exited state. This dual emission behavior was indeed similar to what has been observed in phosphorescent molecular butterflies, where the excited state potential energy surface has two energy minima due to photoinduced structural changes.(38, 39)

The CIE chromaticity coordinates of the overall light emission were determined as (0.21, 0.28) and (0.21, 0.27) for the bulk and microscale perovskites of Example 1, which produced correlated color temperatures (CCTs) of 21242 K and 24154 K respectively, corresponding to "cold" bluish white light.

The broad emissions also lead to good color-rendering indexes (CRIs) of 63 and 66 for the bulk and microscale crystals respectively, which are comparable to the CRIs of typical fluorescent light sources (~65). The photoluminescence quantum efficiencies (PLQEs) of bulk and microscale crystals were measured to be about 18 to about 20% and about 10 to about 12%, respectively. It is noteworthy that 20% PLQE represented a doubled PLQE of the 2D perovskite (EDBE)[PbBr$_4$] (9%).(22) Based on the PLQEs and lifetimes, the radiative decay rates were calculated to be about $0.51 \times 10^7$ s$^{-1}$ and about $0.41 \times 10^7$ s$^{-1}$ for bulk and microscale crystals, respectively, while the nonradiative decay rates were about $2.17 \times 10^7$ s$^{-1}$ and $3.35 \times 10^7$ s$^{-1}$ for bulk and microscale crystals respectively. The higher nonradiative decay rate for microscale crystals is not surprising if one considers the much larger surface areas that lacks of quantum confinement and creates nonradiative decay channels. Table 1 summarizes the major photophysical properties for the bulk and microscale 1D lead bromide perovskites.

TABLE 1

Photophysical properties of bulk and microscale 1D lead bromide perovskites.

| 1D Perovskites | T (K) | $\lambda_{abs}$ (nm) | $\lambda_{em}$ (nm) | $\phi$ (%) | $\tau_{av}$ (ns) | $k_r$ (ns$^{-1}$) × 10$^7$ | $k_{nr}$ (ns$^{-1}$) × 10$^7$ |
|---|---|---|---|---|---|---|---|
| Bulk Crystals | 295 | 379 | 475 | 18-20 | 37.3 | 0.51 | 2.17 |
|  | 77 | N/A | 525 | N/A | 1443.6 | N/A | N/A |
| Microscale Crystals | 295 | 371 | 475 | 10-12 | 26.6 | 0.41 | 3.35 |
|  | 77 | N/A | 525 | N/A | 1347.4 | N/A | N/A |

$\lambda_{abs}$ is the wavelength at absorbance maximum;
$\lambda_{em}$ is the wavelength at the emissio maxima, $\phi$ is the PL quantum yield;
$\tau_{av}$ is the PL lifetime;
$k_r$ and $k_{nr}$ are the radiative and non-radiative decay rates calculated from equations, $k_r = \phi/\tau$ and $k_{nr} = (1 - \phi)/\tau$ To verify the origin of the broadband emission from intrinsic self-trapped excitons, the dependence of the room-temperature luminescence intensity on the excitation power for bulk and microscale crystals was measured, as well as their low temperature (77 K) emissions.

Figure 10:
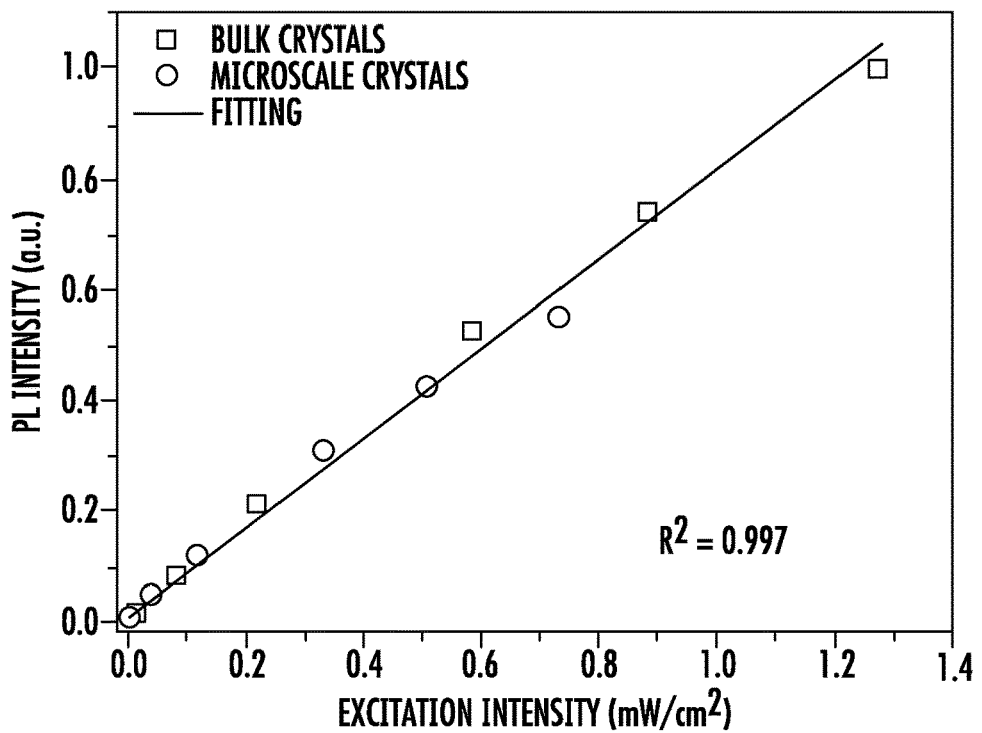
FIG. 10 depicts the photoluminescence intensity vs. excitation power for embodiments of both bulk and microscale 1D perovskite crystals at room temperature.
Figure 11:
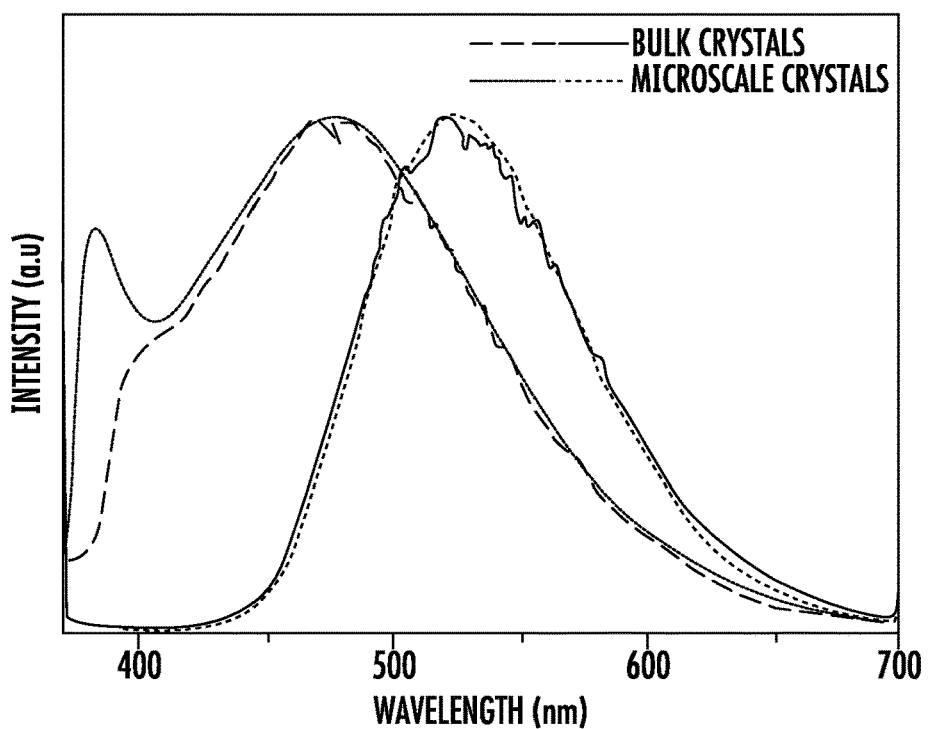
FIG. 11 depicts the emissions of embodiments of bulk and microscale 1D perovskite crystals at room temperature (dot lines) and 77 K (solid lines).
Figure 12:
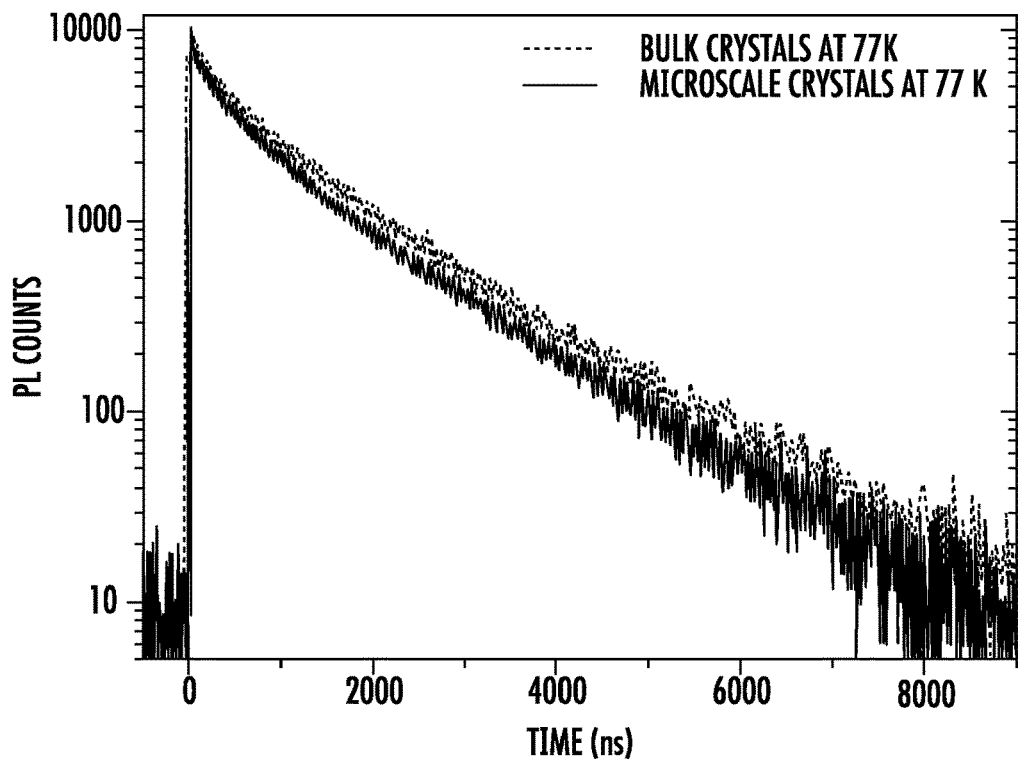
FIG. 12 depicts the luminescence decays of embodiments of bulk and microscale 1D perovskite crystals at 77 K (measured at 525 nm).

As depicted at FIG. 10, the intensity of the broadband emission exhibited a linear dependence on the excitation intensity up to 500 W/cm$^2$, which suggested that emission did not arise from permanent defects. At 77 K, the bulk and microscale crystals exhibited broadband, Gaussian-shaped, and strongly Stokes shifted luminescence (FIG. 11), with the same features as those of self-trapped excitons observed in many metal halide crystals at low temperature and corrugated 2D halide perovskites. In those cases, electron-spin resonance measurements and ab-initio calculations identified Pb$_2^{3+}$, Pb$^{3+}$ and X$_2^-$ (X=Cl, Br) as the radiative indirect band trap states (D. Cortecchia et al., *arXiv* 1603.01284, (2016); and R. T. Williams, et al., *Journal of Physics and Chemistry of Solids* 51, 679-716 (1990). FIG. 12 depicts the emission decays at 77 K, with long lifetimes calculated to be 1443.6 ns and 1347.4 ns for bulk and microscale crystals respectively. Consistent with the data collected at room temperature, the microscale crystals possessed slightly higher nonradiative decay rate than the bulk crystals at 77 K.

Figure 13:
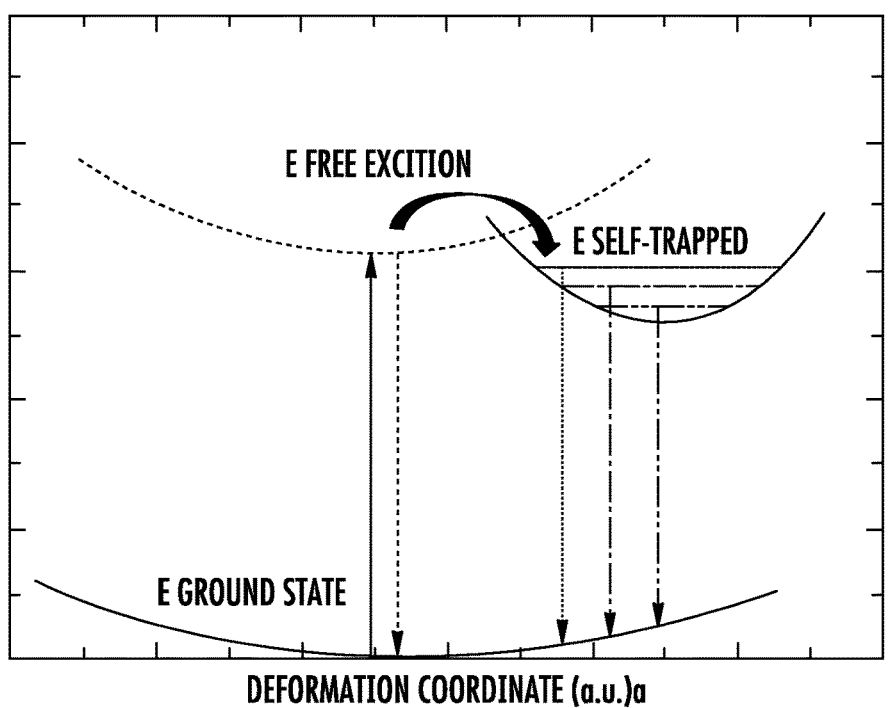
FIG. 13 depicts a theoretical configuration coordinate diagram for the coexisting of free and self-trapped excitons in an embodiment of a 1D hybrid perovskite; the straight and curved arrows represent optical and relaxation transitions, respectively.

Therefore, not wishing to be bound by any particular theory, it was believed that the exciton self-trapping in the 1D lead bromide perovskites can be described in the configuration coordinate diagram given in FIG. 13: at room temperature, the free excitons and self-trapped excitons coexisted due to an equilibrium created by thermal activation. This resulted in the bluish white-light emission with two bands: a high energy narrow band of free excitons and a low energy broad band of self-trapped excitons. At 77 K (low thermal activation), all excitons were in self-trapped states, resulting in only broadband strongly Stokes shifted luminescence. This model also offered a natural explanation of the observation that the emission spectra for the bulk and microscale crystals were different at room temperature, but identical at 77 K. At room temperature, the self-absorption in the bulk crystals was stronger than in the microscale crystals, leading to lower emission intensity from the free excitons at ~389 nm. However, at 77 K, all the excitons were in the indirect self-trapped states for both bulk and microscale crystals, resulting in exact same emission without self-absorption.

Example 4—Growth of $C_4N_2H_{14}PbCl_4$, $C_4N_2H_{14}PbBr_4$, and $C_4N_2H_{14}PbI_4$ Single Crystals Single crystals were produced according to the following procedures:

1. $C_4N_2H_{14}PbCl_4$ Single Crystals

Lead (II) chloride (0.278 g, 1.0 mmol) and N, N'-dimethylethylenediammonium chloride (0.161 g, 1.0 mmol) were combined in dimethyl sulfoxide and sonicated for 10 minutes to obtain a clear solution. 1 mL of the stock solution was set up in vapor diffusion chambers with acetone. Colorless plate-like crystals of $C_4N_2H_{14}PbCl_4$ were obtained through diffusion of acetone into this solution over a 24 h period. The crystals suitable for X-ray structure determination were washed with acetone, and dried under reduced pressure to afford 0.021 g (yield of ~48%) of product. Element analysis: $C_4N_2H_{14}PbCl_4$, calculated C, 10.94%; H, 3.21%; N, 6.38%; found C, 10.90%; H, 3.15%; N, 6.23%.

2. $C_4N_2H_{14}PbBr_4$ Single Crystals

Lead (II) bromide (0.100 g, 0.27 mmol) and N, N'-dimethylethylenediamine (0.024 g, 0.27 mmol) were combined in 10 mL of 48 wt. % hydrobromic acid and sonicated for 10 minutes to obtain a clear solution. 1 mL of the stock solution was set up in vapor diffusion chambers with acetone. Colorless needle-like crystals of $C_4N_2H_{14}PbBr_4$ were obtained through diffusion of acetone into this solution over a 24 h period. The crystals suitable for X-ray structure determination were washed with acetone, and dried under reduced pressure to afford 0.010 g (yield of ~60%) of product. Element analysis: $C_4N_2H_{14}PbBr_4$, calculated C, 7.79%; H, 2.29%; N, 4.54%; found C, 7.81%; H, 2.18%; N, 4.44%.

3. $C_4N_2H^{14}PbI_4$ Single Crystals

Lead (II) iodide powder (0.100 g, 0.22 mmol) was dissolved in a mixture of 57% w/w aqueous HI solution (5 mL) and 50% aqueous $H_3PO_2$ (1 mL) by heating to boiling under constant magnetic stirring for about 5 min. Subsequent addition of DMEDA (0.020 g, 0.22 mmol) to the hot solution affords a clear bright yellow solution. The stirring was then discontinued, and the solution was left to slowly cool to room temperature and stand overnight to afford red single crystals. The crystals suitable for X-ray structure determination were washed with acetone, and dried under reduced pressure to afford 0.125 g (yield of ~71%) of product. Element analysis: $C_4N_2H_{14}PbI_4$, calculated C, 5.97%; H, 1.75%; N, 3.48%; found C, 6.12%; H, 1.66%; N, 3.51%.

Reacting lead (II) chloride (PbCl$_2$) with N, N'-dimethylethylenediammonium chloride in dimethyl sulfoxide solution at room temperature yielded the 1D lead chloride crystal in ~50% yield. Reacting lead (II) bromide (PbBr$_2$) with N, N'-dimethylethylenediamine ($CH_3NHCH_2CH_2NHCH_3$, $C_4N_2H_{12}$) in hydrogen bromide (HBr) aqueous solution at room temperature yielded the 1D lead bromide perovskite single crystals in ~60% yield. PbI$_2$, on the other hand, tends to be oxidized in the air. Therefore, 1D lead (II) iodide perovskite single crystals were synthesized by adding PbI$_2$ and $C_4N_2H_{12}$ into a mixture of hydroiodic acid (HI) and hypophosphorous acid ($H_3PO_2$) under nitrogen atmosphere at 120° C., followed by cooling down to room temperature overnight in a yield of ~70%.

Example 5—Analysis and Characterization of Crystals of Example 4

The structure and composition of the perovskites of Example 4 were fully characterized using Single Crystal X-Ray Diffraction (SCXRD), Powder X-Ray Diffraction (PXRD) and Elemental Analysis.

1. Single Crystal X-Ray Diffraction (SCXRD) of $C_4N_2H_{14}PbCl_4$

Single crystal x-ray diffraction data of $C_4N_2H_{14}PbCl_4$ was collected using an Oxford-Diffraction Xcalibur-2 CCD diffractometer with graphite-monochromated Mo Kα radiation. The crystal was mounted in a cryoloop under Paratone-N oil and cooled to 100 K with an Oxford-Diffraction Cryojet. A complete sphere of data was collected using ω scans with 1° frame widths to a resolution of 0.6 Å, equivalent to 2 θ≈72.5°. Reflections were recorded, indexed and corrected for absorption using the Oxford-Diffraction CrysAlisPro software, and subsequent structure determination and refinement was carried out using CRYSTALS, employing Superflip to solve the crystal structure. The refinement was performed against F$^2$, with anisotropic thermal displacement parameters for all non-hydrogen atoms and with isotropic thermal displacement parameters for the hydrogens in the structure. All hydrogens were restrained to the connecting nitrogen or carbon. A CIF has been deposited with CCDC (No. 1510582) and ICSD (No. 432101).

2. Single Crystal X-Ray Diffraction (SCXRD) of $C_4N_2H_{14}PbBr_4$ and of $C_4N_2H_{14}PbI_4$ A single crystal was mounted on a nylon loop with the use of heavy oil. The sample was held at −170° C. for data collection. The data were taken on a Bruker SMART APEX II diffractometer using a detector distance of 6 cm. The number of frames taken was 2400 using 0.3 degree omega scans with either 20 or 30 seconds of frame collection time.

Integration was performed using the program SAINT which is part of the Bruker suite of programs. Absorption corrections were made using SADABS. XPREP was used to obtain an indication of the space group and the structure was typically solved by direct methods and refined by SHELXTL. The non-hydrogen atoms were refined anisotropically. A matrix was run at 253 K (−20° C.) to check on whether a phase change could have occurred with the structure run at low temperatures. The index was the essentially same found at low temperature, likely ruling out a phase change.

The basic structure appeared to include [$PbX_4^{2-}$]. double chains wrapped by $C_4N_2H_{14}^{2+}$ cations, which can be considered as a crystalline bulk assembly of core-shell quantum wires. These structures all crystallized in the orthorhombic Imma space group. Unlike the typical corner sharing octahedral $PbX_6^{4-}$ units in 3D and 2D lead halide perovskites, or mixed octahedral-trigonal prismatic $PbI_3^-$ units found in 1D hybrid lead iodides, the inorganic framework of the 1D structure of the crystals of Example 4 is made of double edge-sharing octahedral $PbX_6^{4-}$ units.

Although the 1D lead halide perovskites of Example 4 possessed the same type of crystal structure, the distances between lead and halide atoms were slightly different for Cl, Br and I, due to their different atomic radii. The short Pb—X bonds were 2.710 Å, 2.846 Å, and 3.055 Å for Cl, Br and I perovskites, respectively, while the longest Pb—X bonds were 3.148 Å, 3.242 Å, and 3.400 Å for Cl, Br and I perovskites, respectively. Considering the much smaller covalent radius of Cl ions (~1.02 Å) than that of Br ions (~1.20 Å), the relatively long Pb—Cl bond indicates a much less efficient packing with a weaker interaction between Pb and Cl atoms, which could lead to an easier structural distortion in the excited states.

The SCXRD data collected for the crystals of Examples 4 are provided at the following tables:
Single Crystal X-Ray Diffraction Data of 1D Lead Halide Perovskites:

| Compound | $C_4N_2H_{14}PbCl_4$ | $C_4N_2H_{14}PbBr_4$ | $C_4N_2H_{14}PbI_4$ |
|---|---|---|---|
| Formula weight | 439.18 | 617.00 | 804.96 |
| T (K) | 100(1) | 103(2) | 103(2) |
| λ (Å) | 0.71073 | 0.71073 | 0.71073 |
| Crystal system | Orthorhombic | Orthorhombic | Orthorhombic |
| Space group | I m m a | I m m a | I m m a |
| Unit cell dimensions | | | |
| a (Å) | 14.1404(3) | 14.6230(16) | 15.415(3) |
| b (Å) | 5.7983(2) | 6.1041(7) | 6.5261(13) |
| c (Å) | 14.2252(2) | 14.4070(16) | 14.859(3) |
| α | 90° | 90° | 90° |
| β | 90° | 90° | 90° |
| γ | 90° | 90° | 90° |
| V (Å³) | 1166.3(4) | 1286.0(2) | 1494.8(5) |
| Z | 4 | 4 | 4 |
| ρ (Mg/m³) | 2.570 | 3.187 | 3.577 |
| μ (mm⁻¹) | 15.335 | 25.504 | 19.511 |
| F(000) | 856 | 1096 | 1384 |
| Reflections collected | 20523 | 7142 | 8940 |
| Independent reflections | 1649 | 895 | 1128 |
| $R_{int}$ | 0.1050 | 0.0481 | 0.0314 |
| Goodness-of-fit | 1.083 | 1.137 | 2.033 |
| $R_1$ [I > 2σ(I)] | 0.0302 | 0.0182 | 0.0165 |
| $wR_2$ [I > 2σ(I)] | 0.0575 | 0.0416 | 0.0347 |
| Largest diff. peak and hole (e Å⁻³) | 5.370/−2.890 | 1.068/−1.161 | 1.301/−1.348 |

Atomic Coordinates (×10⁴) of $C_4N_2H_{14}PbCl_4$ (all Non-Hydrogens were Refined with Anisotropic Displacement Parameters, while the Hydrogens were Refined with Isotropic Displacement Parameters.)

| Atom | x | y | z | $U_{eq}$ (Å² × 10³) |
|---|---|---|---|---|
| Pb(1) | 5000 | 7500 | 1148(2) | 10(1) |
| Cl(1) | 5000 | 7500 | 3054(2) | 17(1) |
| Cl(2) | 2972(1) | 7500 | 1007(1) | 15(1) |
| Cl(3) | 5000 | 2500 | 1064(2) | 18(1) |
| N(1) | 2140(3) | 2500 | 1230(3) | 14(1) |
| C(1) | 1220(4) | 2500 | 743(4) | 18(1) |
| C(2) | 2027(4) | 2500 | 2264(3) | 17(1) |

Selected Bonds and Angles for $C_4N_2H_{14}PbCl_4$:

| Bond | Distance (Å) |
|---|---|
| Pb1 - Cl1 | 2.710(2) |
| Pb1 - Cl2 | 2.875(1) |
| Pb1 - Cl3 (approx. along [010]) | 2.902(1) |
| Pb1 - Cl3 (approx. along [001]) | 3.148(1) |

| Bonds | Angle (°) |
|---|---|
| Cl1 - Pb1 - Cl3 | 180.00 |
| Cl2 - Pb1 - Cl2 | 171.95 |
| Cl3 - Pb1 - Cl3 | 175.28 |

Atomic Coordinates (×10⁴) of $C_4N_2H_{14}PbBr_4$ (all Non-Hydrogens were Refined with Anisotropic Displacement Parameters, while the Hydrogens were Refined with Isotropic Displacement Parameters.)

| Atom | x | y | z | $U_{eq}$ (Å² × 10³) |
|---|---|---|---|---|
| Pb(1) | 10000 | 2500 | 1155(1) | 7(1) |
| Br(1) | 7953(1) | 2500 | 1031(1) | 11(1) |
| Br(2) | 10000 | 7500 | 1095(1) | 12(1) |
| Br(3) | 10000 | 2500 | 3130(1) | 14(1) |
| N(1) | 7128(2) | 7500 | 1248(2) | 11(1) |
| C(1) | 7030(3) | 7500 | 2269(3) | 14(1) |
| C(2) | 6221(3) | 7500 | 774(3) | 14(1) |

Selected Bonds and Angles for $C_4N_2H_{14}PbBr_4$

| Bond | Distance (Å) |
|---|---|
| Pb1 - Br1 | 2.999 |
| Pb1 - Br2 (approx. along [010]) | 3.053 |
| Pb1 - Br2 (approx. along [001]) | 3.242 |
| Pb1 - Br3 | 2.846 |

| Bonds | Angle (°) |
|---|---|
| Br1 - Pb1 - Br1 | 173.17 |
| Br2 - Pb1 - Br2 | 176.72 |
| Pb1 - Br2 - Pb1 | 176.72 |

Atomic Coordinates (×10⁴) of $C_4N_2H_{14}PbI_4$ (all Non-Hydrogens were Refined with Anisotropic Displacement Parameters, while the Hydrogens were Refined with Isotropic Displacement Parameters.)

| Atom | x | y | z | $U_{eq}$ (Å² × 10³) |
|---|---|---|---|---|
| Pb(1) | 0 | 2500 | 1163(1) | 9(1) |
| I(1) | 2066(1) | 2500 | 1052(1) | 12(1) |

-continued

| Atom | x | y | z | $U_{eq}$ (Å$^2$ × 10$^3$) |
|---|---|---|---|---|
| I(2) | 0 | 2500 | −1126(1) | 12(1) |
| I(3) | 0 | 2500 | 3219(1) | 16(1) |
| N(1) | 2123(2) | 7500 | 3707(2) | 14(1) |
| C(1) | 1257(2) | 7500 | 4156(3) | 18(1) |
| C(2) | 2046(2) | 7500 | 2711(2) | 17(1) |

Selected Bonds and Angles for $C_4N_2H_{14}PbI_4$

| Bond | Distance (Å) |
|---|---|
| Pb1 - I1 | 3.190 |
| Pb1 - I2 (approx. along [010]) | 3.264 |
| Pb1 - I2 (approx. along [001]) | 3.400 |
| Pb1 - I3 | 3.055 |

| Bonds | Angle (°) |
|---|---|
| I1 - Pb1 - I1 | 174.09 |
| I2 - Pb1 - I2 | 178.06 |
| I3 - Pb1 - I2 | 180.00 |

3. Powder X-Ray Diffraction (PXRD)

The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern was scanned over the angular range of 5-50 degree (2θ) with a step size of 0.02, at room temperature.

Figure 14:
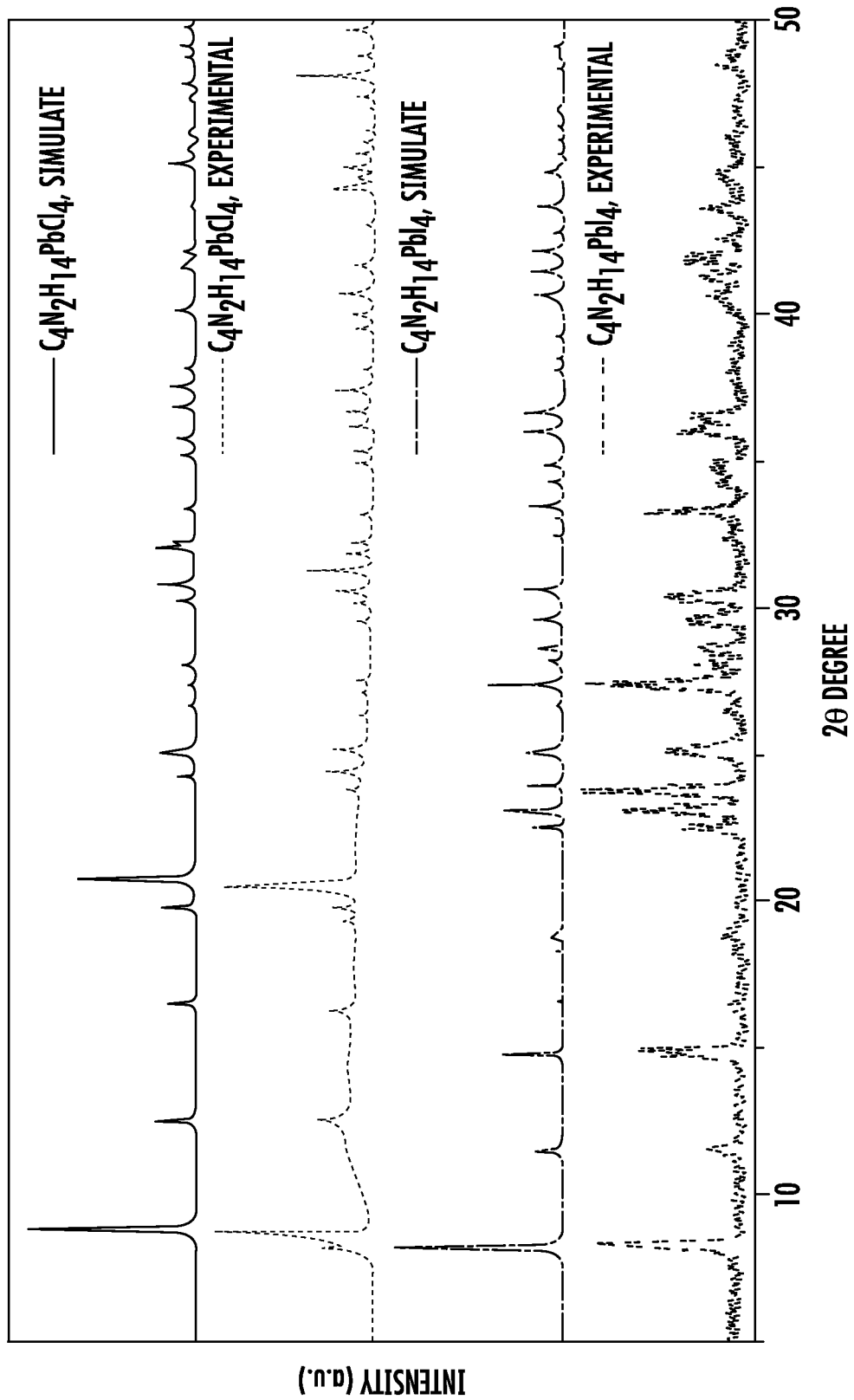
FIG. 14 depicts powder X-ray diffraction patterns of embodiments of 1D lead halide perovskites and simulated results.

FIG. 14 depicts PXRD of the 1D lead halide perovskites of Examples 4, as well as their simulated results. The PXRD patterns of ball-milled crystal powders displayed identical features as simulated patterns from SCXRD, suggesting a uniform crystal structure of as-synthesized bulk crystals.

4. Absorption Spectrum Measurements

Absorption spectra of perovskite single crystals were measured at room temperature through synchronous scan in an integrating sphere incorporated into the spectrofluorometer (FLS980, Edinburgh Instruments) while maintaining a 1 nm interval between the excitation and emission monochromators.

5. Photoluminescence Steady State Studies

Steady-state photoluminescence spectra of the perovskite single crystals in solid state were obtained at room temperature and 77 K (liquid nitrogen was used to cool the samples) on a Horiba JY Fluoromax-4 Fluorometer.

6. Photoluminescence Quantum Efficiencies (PLQEs)

For PLQE measurements, the samples were excited using light output from a housed 450 W Xe lamp passed through a single grating (1800 l/mm, 250 nm blaze) Czerny-Turner monochromator and finally a 5 nm bandwidth slit. Emission from the sample was passed through a single grating (18001/mm, 500 nm blaze) Czerny-Turner monochromator (5 nm bandwidth) and detected by a Peltier-cooled Hamamatsu R928 photomultiplier tube. The absolute quantum efficiencies were acquired using an integrating sphere incorporated into the FLS980 spectrofluorometer. The PLQE was calculated by the equation: $\eta_{QE}=I_S/(E_R-E_S)$, in which $I_S$ represents the luminescence emission spectrum of the sample, $E_R$ is the spectrum of the excitation light from the empty integrated sphere (without the sample), and $E_S$ is the excitation spectrum for exciting the sample. Control samples, Rhodamine 101 and blue phosphor $BaMgAl_{10}O_{17}:Eu^{2+}$, were measured using this method to give PLQEs of ~98% and ~93%, which are close to the literature reported values.

7. Time-Resolved Photoluminescence

Time-Resolved Emission data were collected at room temperature and 77 K (liquid nitrogen was used to cool the samples) using time-correlated single photon counting on a Horiba JY Fluoromax-4 Fluorometer. Samples were excited with 295 nm or 370 nm pulsed diode lasers. Emission counts were monitored at the maximum of sample's emission peak. The average lifetime was obtained from the multi-exponential decays according to equation 1.

$$\tau_{ave}=\Sigma\alpha_i\tau_i^2/\Sigma\alpha_i\tau_i, i=1,2,3\ldots \quad (1)$$

where $\tau_i$ represents the decay time and $\alpha_i$ represents the amplitude of each component.

The major photophysical properties of the 1D lead halide perovskite crystals of Example 4 were characterized by absorption spectroscopy, as well as steady state and time-resolved photoluminescence spectroscopies at room temperature and 77 K, as summarized at the following table:

Summary of the Photophysical Properties of 1D Lead Halide Perovskites at Room Temperature and 77K

| 1D Perovskites | $C_4N_2H_{14}PbCl_4$ | $C_4N_2H_{14}PbBr_4$ | $C_4N_2H_{14}PbI_4$ |
|---|---|---|---|
| $\lambda_{abs}$, nm | 325 | 379 | 495 |
|  | 509 | 475 | 665 |
| $\lambda_{em}$, nm | 509[a] | 525[a] | 705[a] |
| Stokes Shift, nm (eV) | 184 (1.38) | 96 (0.66) | 170 (0.64) |
| FWHM, nm (eV) | 114 (0.55) | 157 (0.90) | 125 (0.35) |
|  | 124 (0.61)[a] | 104 (0.46)[a] | 118 (0.29)[a] |
| φ | 0.10 | 0.20 | 0.01 |
|  | 4.5 | 23.4 | 1615 |
| $\tau_{av}$, ns | 1697[a] | 1345[a] | 1627[a] |

$\lambda_{abs}$ is the wavelength at absorbance maximum;
$\lambda_{em}$ is the wavelength at the emission maximum,
φ is the PL quantum efficiency;
$\tau_{av}$ is the PL lifetime,
[a] @ 77K.

Figure 15:
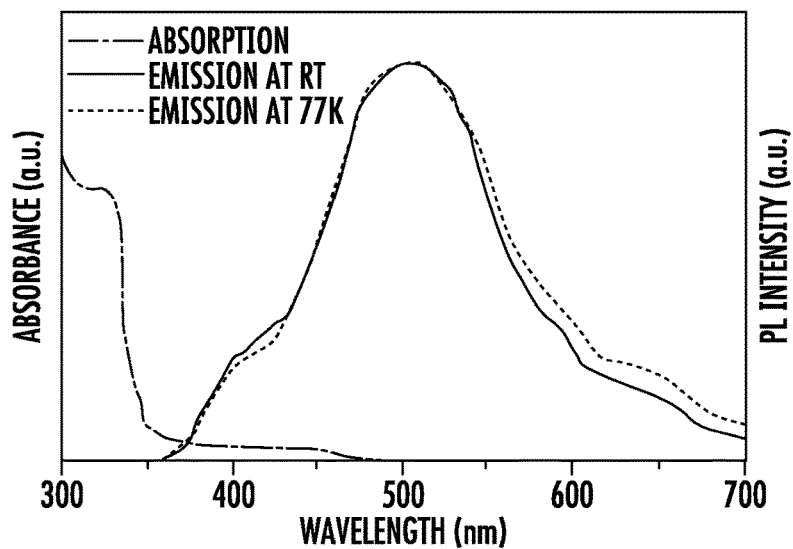
FIG. 15 depicts absorption and emission spectra at room temperature and 77K for an embodiment of 1D lead halide perovskite crystals of the formula $C_4N_2H_{14}PbCl_4$.
Figure 16:
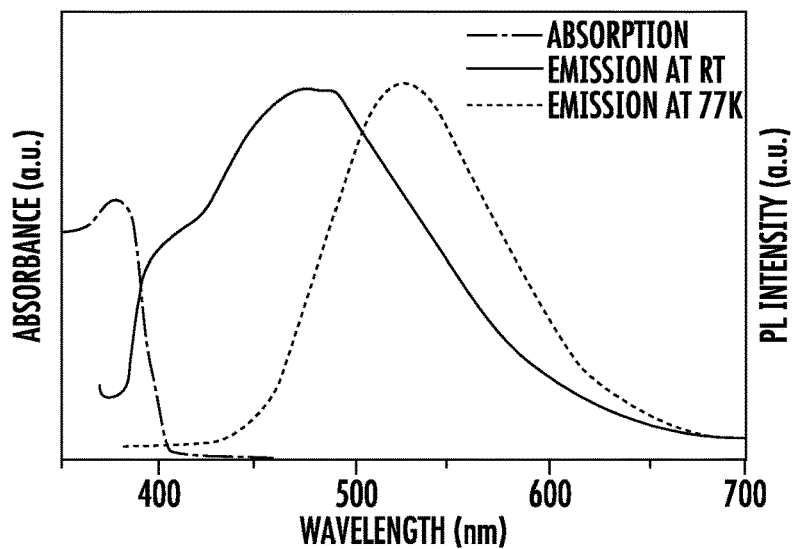
FIG. 16 depicts absorption and emission spectra at room temperature and 77K for an embodiment of 1D lead halide perovskite crystals of the formula $C_4N_2H_{14}PbBr_4$.
Figure 17:
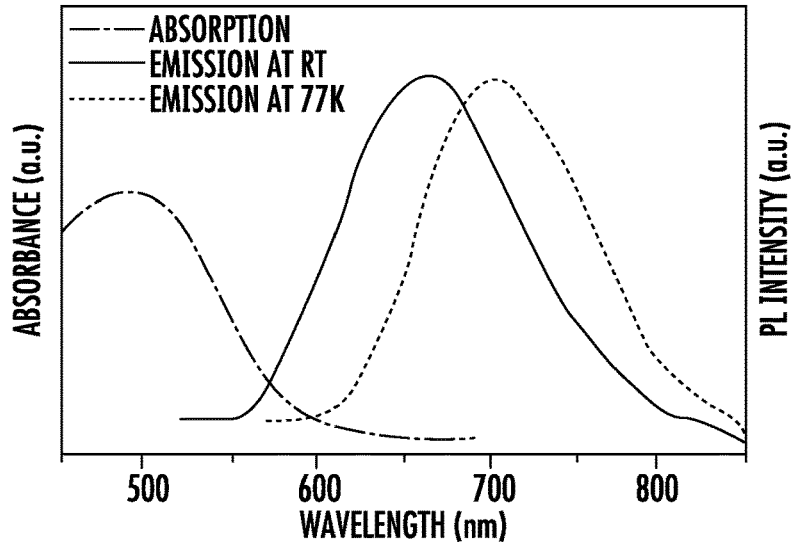
FIG. 17 depicts absorption and emission spectra at room temperature and 77K for an embodiment of 1D lead halide perovskite crystals of the formula $C_4N_2H_{14}PbI_4$.
Figure 18:
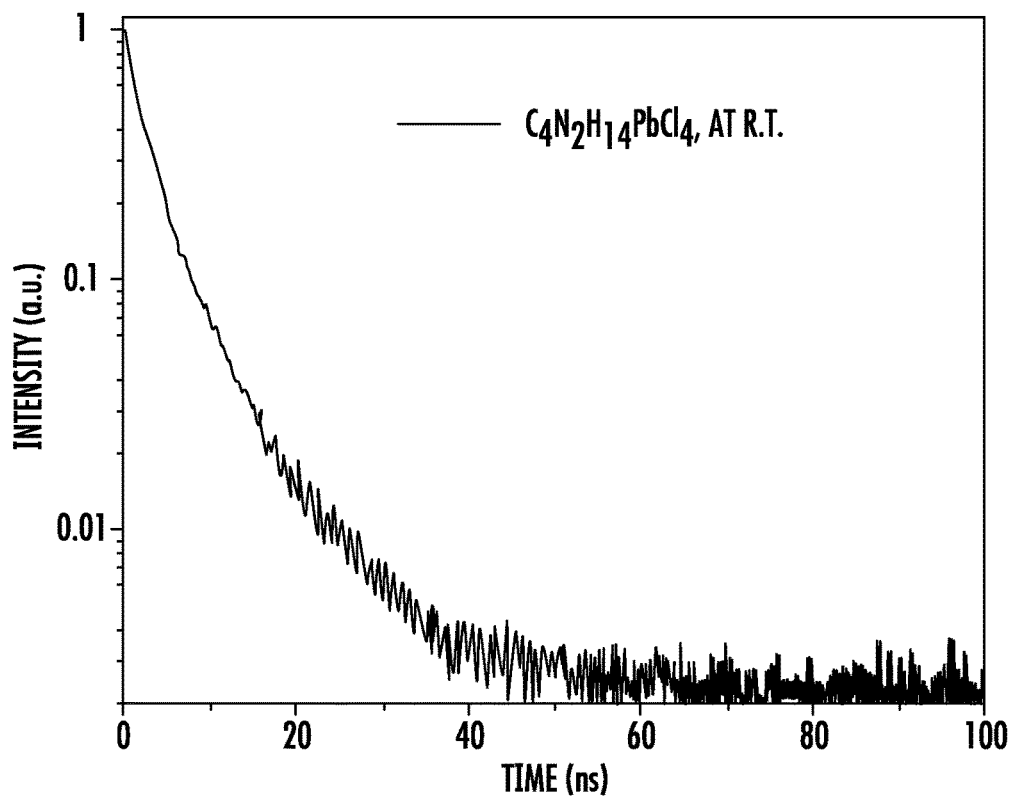
FIG. 18 depicts a photoluminescence decay profile of an embodiment of 1D lead chloride perovskite crystals at room temperature.
Figure 19:
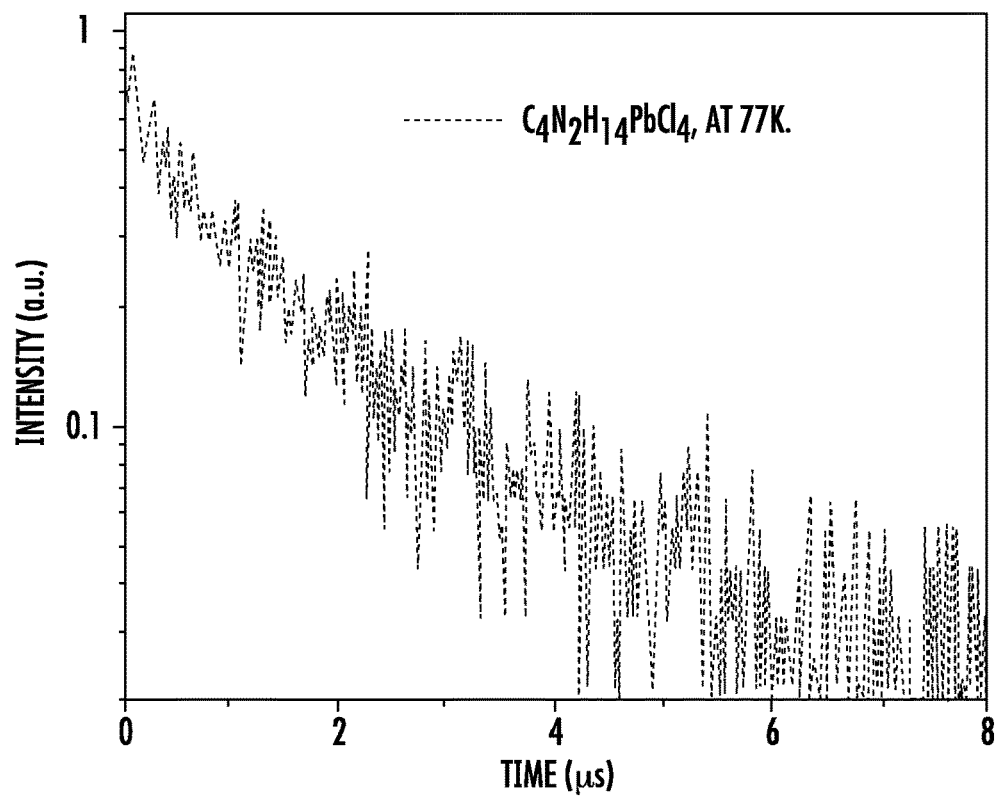
FIG. 19 depicts a photoluminescence decay profile of an embodiment of 1D lead chloride perovskite crystals at 77K.
Figure 20:
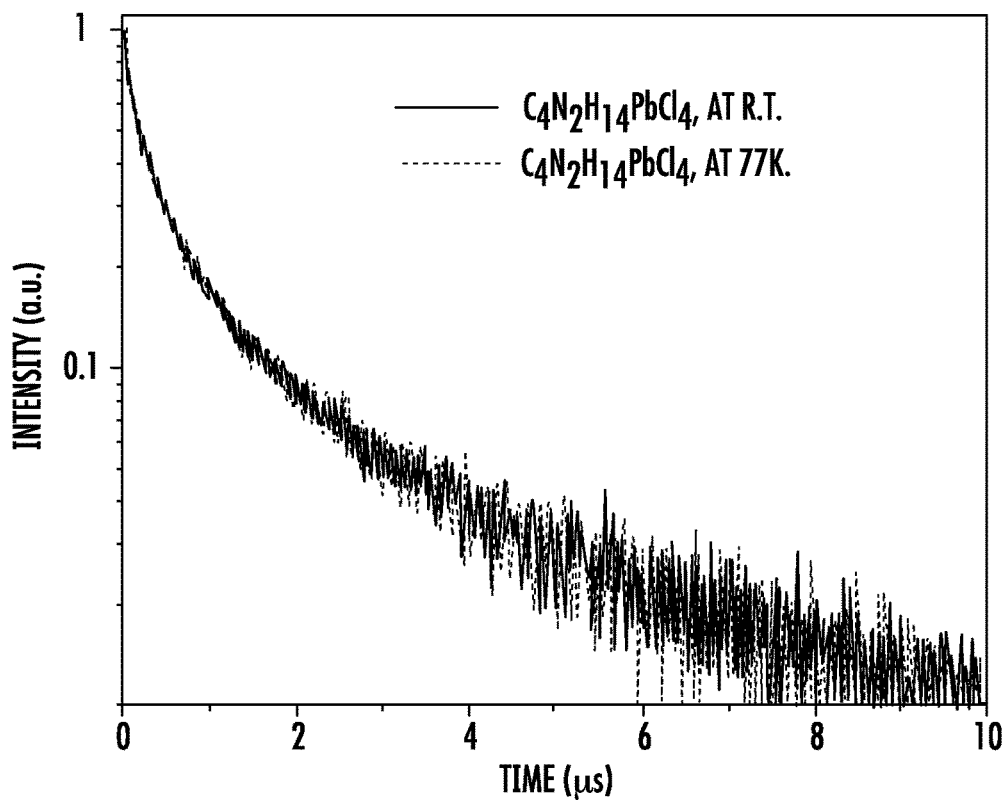
FIG. 20 depicts photoluminescence decay profiles of the 1D lead iodide perovskite crystals of Example 6 at room temperature and 77K.

White, bluish-white, and red emissions were observed for $C_4N_2H_{14}PbCl_4$, $C_4N_2H_{14}PbBr_4$ and $C_4N_2H_{14}PbI_4$, respectively, as depicted at FIG. 15, FIG. 16, and FIG. 17, respectively. For the absorption spectra, the absorption peaks of these 1D lead halide perovskites red shift from 325, 379 to 495 nm for Cl, Br and I, consistent with the order of the ligand field strengths of the three halogen ions (I<Br<Cl).[36] Such a deceasing of absorption energy from Cl to Br and I has been observed in all metal halide perovskites reported to date. Upon photoexcitation at room temperature, all these single crystals exhibited broad emissions, with peaks at 509, 475 and 665 nm for Cl, Br and I perovskites, respectively. These emissions all have large full width at half maxima (FWHM) of 114 nm (0.55 eV), 157 nm (0.90 eV) and 125 nm (0.35 eV), as well as Stokes shifts of 184 nm (1.38 eV), 96 nm (0.66 eV) and 170 nm (0.64 eV) for Cl, Br and I perovskites, respectively. The corresponding CIE chromaticity coordinates of these emissions at room temperature were determined as (0.26, 0.39), (0.21, 0.28) and (0.63, 0.37), correlated color temperatures (CCTs) as 8576 K, 21242 K and 1383 K, and color-rendering indexes (CRIs) as 63, 63 and 53. These broadband emissions are the results of exciton self-trapping in quantum confined 1D structures. The PL decays (τ) of these 1D lead halide perovskites were determined to be of the order of 4.5, 23, 1615 ns (Figure S2-S3), and the PLQEs (φ) were measured as 0.10, 0.20 and 0.01 at room temperature for Cl, Br and I perovskites, respectively. FIG. 18 and FIG. 19 depict photoluminescence decay profiles of the 1D lead chloride perovskite crystals of Example 4 at room temperature and 77K. FIG. 20 depicts photoluminescence decay profiles of the 1D lead iodide perovskite crystals of Example 6 at room temperature and 77K.

Unlike 1D $C_4N_2H_{14}PbBr_4$ with a dual emission from both the free exciton and self-trapped excited states, 1D $C_4N_2H_{14}PbCl_4$ and $C_4N_2H_{14}PbI_4$ had no shoulder emissions in the high-energy direct band edge regions, suggesting efficient energy relaxation from the free exciton excited states to self-trapped excited states and no thermally activated equilibrium between two excited states at room temperature. At 77 K, all the 1D perovskites of Example 4 exhibited similar broadband, Gaussian-shaped, and strongly Stokes shifted luminescence, with the same features as those of self-trapped excitons observed in many metal halide crystals at low temperature and corrugated 2D halide perovskites (see, e.g., Dohner, E. R. et al., *J Am Chem Soc* 2014, 136, (5), 1718-1721). The emission decays of $C_4N_2H_{14}PbCl_4$ and $C_4N_2H_{14}PbBr_4$ had significantly longer lifetimes of 1697 ns and 1345 ns at 77 K than at room temperature. $C_4N_2H_{14}PbI_4$, on the other hand, had similar emission lifetimes of 1615 ns at room temperature and 1627 ns at 77 K, indicating similar decay pathways at both room temperature and 77 K. These triplet-like long lifetimes in microseconds are the characteristics of emissions from the localized self-trapped excited states, which are significantly different from the singlet-like narrow emissions with nanosecond lifetimes from the free exciton excited states in typical 3D and 2D perovskites with delocalized excitonic character.

Band gap control and color tuning by changing the halide have been extensively explored in 3D and 2D metal halide perovskites, among which chloride perovskites possess the highest band gaps and iodide perovskites the lowest band gaps (see, e.g., Wei, S. et al., *Chem Commun* 2016, 52, (45), 7265-7268; Zhang, F. et al., *Acs Nano* 2015, 9, (4), 4533-4542; Aharon, S. et al., *Nano Lett* 2016, 16, (5), 3230-3235; Sun, S. B. et al., *Acs Nano* 2016, 10, (3), 3648-3657; and Weidman, M. C. et al., *Acs Nano* 2016, 10, (8), 7830-7839; Protesescu, L. et al., *Nano Lett* 2015, 15, (6), 3692-3696). Surprisingly, this was not the case for 1D metal halide perovskites of Example 4.

Instead, 1D $C_4N_2H_{14}PbCl_4$ had a red-shifted emission with a larger Stokes shift, as compared to the 1D $C_4N_2H_{14}PbBr_4$. This surprising phenomena may be explained by the photoluminescence mechanism of 1D metal halide perovskites, i.e. emission from the self-trapped excited states with structural distortions. As compared to $C_4N_2H_{14}PbBr_4$, $C_4N_2H_{14}PbCl_4$ may have a stronger ligand field effect that leads to a larger direct band gap with higher energy absorption. However, the mismatch in ionic radii between Pb and Cl ions may lead to a less efficiently packed in $C_4N_2H_{14}PbCl_4$ and thus a more flexible structure than that of $C_4N_2H_{14}PbBr_4$. Therefore, 1D $C_4N_2H_{14}PbCl_4$ may be more susceptible to structural distortions in the excited state than $C_4N_2H_{14}PbBr_4$. $C_4N_2H_{14}PbI_4$, on the other hand, has a weaker ligand field effect but higher packing factor.

Figure 21:
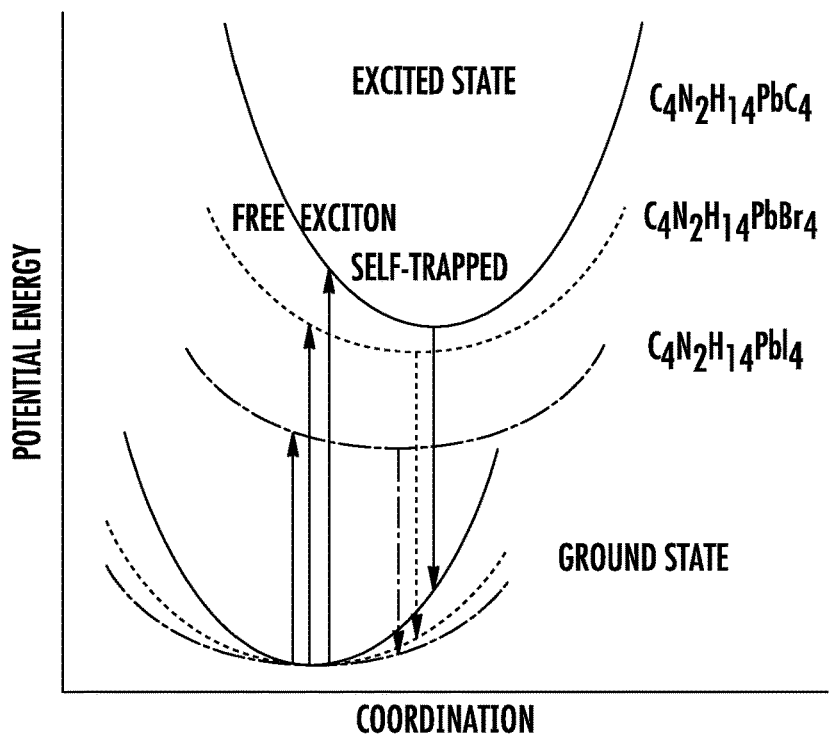
FIG. 21 depicts a potential energy surface diagram for embodiments of 1D metal halide perovskites and a proposed photoluminescence mechanism (the straight arrows represent optical transitions).

FIG. 21 is a schematic drawing of potential energy surfaces for the three lead halide perovskites of Example 4. The large structural distortion of 1D $C_4N_2H_{14}PbCl_4$ may lead to a deeper potential energy surface, resulting in a larger Stokes shift and lower emission energy, as compared to $C_4N_2H_{14}PbBr_4$. $C_4N_2H_4PbI_4$ had a similar structural distortion as $C_4N_2H_{14}PbBr_4$, of which the photophysical properties, such as low energy absorption and small Stokes shift, were mainly affected by the halide ligand field effect.

Therefore, band gap control and color tuning of 1D lead halide perovskites was demonstrated. The broadband emissions of the metal halide perovskites of Example 4 likely originated from the self-trapped excited states due to the structural distortion upon photoexcitation. Therefore, the photophysical properties of the metal halide perovskites of Example 4 are not only likely controlled by the halide ligand field effect, but also the degree of structural distortions in the excited state. The 1D lead halide perovskites of Example 4, therefore, may open a route towards broadband light emitters, and provide a suitable platform for exploiting the structure-property relationships of bulk quantum wire systems.

Example 6—One Pot Synthesis of $Mn^{2+}$-Doped 1D Lead Bromide Crystals

A series of Mn-doped 1D lead bromide perovskites were prepared via a facile one-pot synthesis method. Dimethyl ethylene ammonium bromide salt ($C_4N_2H_{14}Br_2$), $PbBr_2$, and $MnBr_2$ were dissolved in dimethyl sulfoxide (DMSO) to prepare a clear precursor solution, which was injected into vigorously stirred acetone, and stirred for 10 minutes at room temperature.

The colloidal white solution was then centrifuged to remove the supernatant and afford Mn-doped 1D lead bromide perovskites in a high yield (~80%). By changing the $MnBr_2$ concentration in the precursor solutions, 1D lead bromide perovskites with various $Mn^{2+}$ doping concentrations were prepared.

N,N'-dimethylethylene-1,2-diammonium bromide salts were prepared by adding hydrobromic acid solution (2.2 equiv, 48%) into the N,N'-dimethylethylenediamine (1 equiv) in ethanol at 0° C. The organic salts were obtained after removal of the solvents and starting reagents under vacuum, followed by washing with ethyl ether. The salts were dried and kept in a desiccator for future use.

Lead (II) bromide, Manganese (II) bromide, and N, N'-dimethylethylene-1,2-diammonium bromide were dissolved in DMSO with different $Mn^{2+}$ concentration to form a clear precursor solution. Mn-doped 1D perovskite crystals were precipitated out by adding 100 μL of the as-prepared solution to 10 mL acetone with vigorously stirring for 10 minutes at room temperature. The product was then extracted from the crude solution via centrifugation (4000 rpm, 10 min) and washed by acetone, affording a white powder in high yield after dried under vacuum. Details regarding these procedures are provided at the following table:

Detail of One-Pot Synthesis of $Mn^{2+}$-Doped 1D Lead Bromide Crystals

| Product | Chemical Formula | Reagent (mmol/L) | | | Chemical Yield (%) |
| --- | --- | --- | --- | --- | --- |
| | | $C_4N_2H_{14}Br_2$ | $PbBr_2$ | $MnBr_2$ | |
| Mn08 | $C_4N_2H_{14}Pb_{0.992}Mn_{0.008}Br_4$ | 0.400 | 0.300 | 0.100 | 85 |
| Mn13 | $C_4N_2H_{14}Pb_{0.987}Mn_{0.013}Br_4$ | 0.400 | 0.266 | 0.133 | 95 |
| Mn30 | $C_4N_2H_{14}Pb_{0.970}Mn_{0.030}Br_4$ | 0.400 | 0.200 | 0.200 | 96 |

Example 7—Characterization of $Mn^{2+}$-Doped 1D Lead Bromide Crystals

X-ray fluorescence (XRF) and Powder X-ray diffraction (XRD) were used to characterize the composition and structure of these Mn-doped 1D perovskites of Example 6. The $Mn^{2+}$ doping concentrations were characterized from the semi-quantitative XRF measurements by comparing the content of Mn and Pb. The Mn-doped 1D perovskites with various doping concentrations were determined as $C_4N_2H_{14}Pb_{0.992}Mn_{0.008}Br_4$ (Mn08), $C_4N_2H_{14}Pb_{0.987}Mn_{0.013}Br_4$ (Mn13), and $C_4N_2H_{14}Pb_{0.970}Mn_{0.030}Br_4$ (Mn30), as depicted in the foregoing table.

The structural characterizations using XRD confirmed that the host 1D perovskite structure of the samples of Example 6 is nearly intact after doping the $Mn^{2+}$ ions. Bright white emissions were achieved in the rare-earth free phosphors by combining the self-trapped blue emission from the 1D perovskites of Example 6 and the red emission from the doped $Mn^{2+}$ ions. Therefore, the indirect band emission and dopant emission were combined to create efficient white light emitting materials with potential applications in solid-state lighting and display. The excited state energy flow was directed in a complex system with multiple excited states to achieve the photophysical properties described in this example.

Due to the indirect nature of the self-trapped excited states in the 1D perovskites of Example 6, there was no energy transfer from them to the $Mn^{2+}$ ions, resulting in efficient dual emission. In other words, independent multiple excited states are realized in these materials that produce efficient dual emission. The excited state dynamics present in these materials with self-trapped excited states is significantly different from that in conventional Mn-doped inorganic crystals and three-dimensional (3D) metal halide perovskites, where efficient energy transfer from the free exciton excited states to $Mn^{2+}$ ions often quenches the high-energy emission with only low energy $Mn^{2+}$ luminescence, even at a low $Mn^{2+}$ doping concentration. The emissions of these Mn-doped 1D perovskites possess much improved CRIs of up to 87 and PLQEs of up to 28%, as compared to those of the pristine 1D perovskites of 66 and 12%, respectively.

1. Semi-Quantitative Measurements of $Mn^{2+}$ Concentration

The semi-quantitative measurements were performed on a Panalytical Epsilon 3 X-Ray Fluorometer by using Rhodium X-ray tube.

2. Powder X-Ray Diffraction (PXRD)

The PXRD analysis was performed on Panalytical X'PERT Pro Powder X-Ray Diffractometer using Copper X-ray tube (standard) radiation at a voltage of 40 kV and 40 mA, and X'Celerator RTMS detector. The diffraction pattern was scanned over the angular range of 5-50 degree (2θ) with a step size of 0.02, at room temperature.

Figure 22:
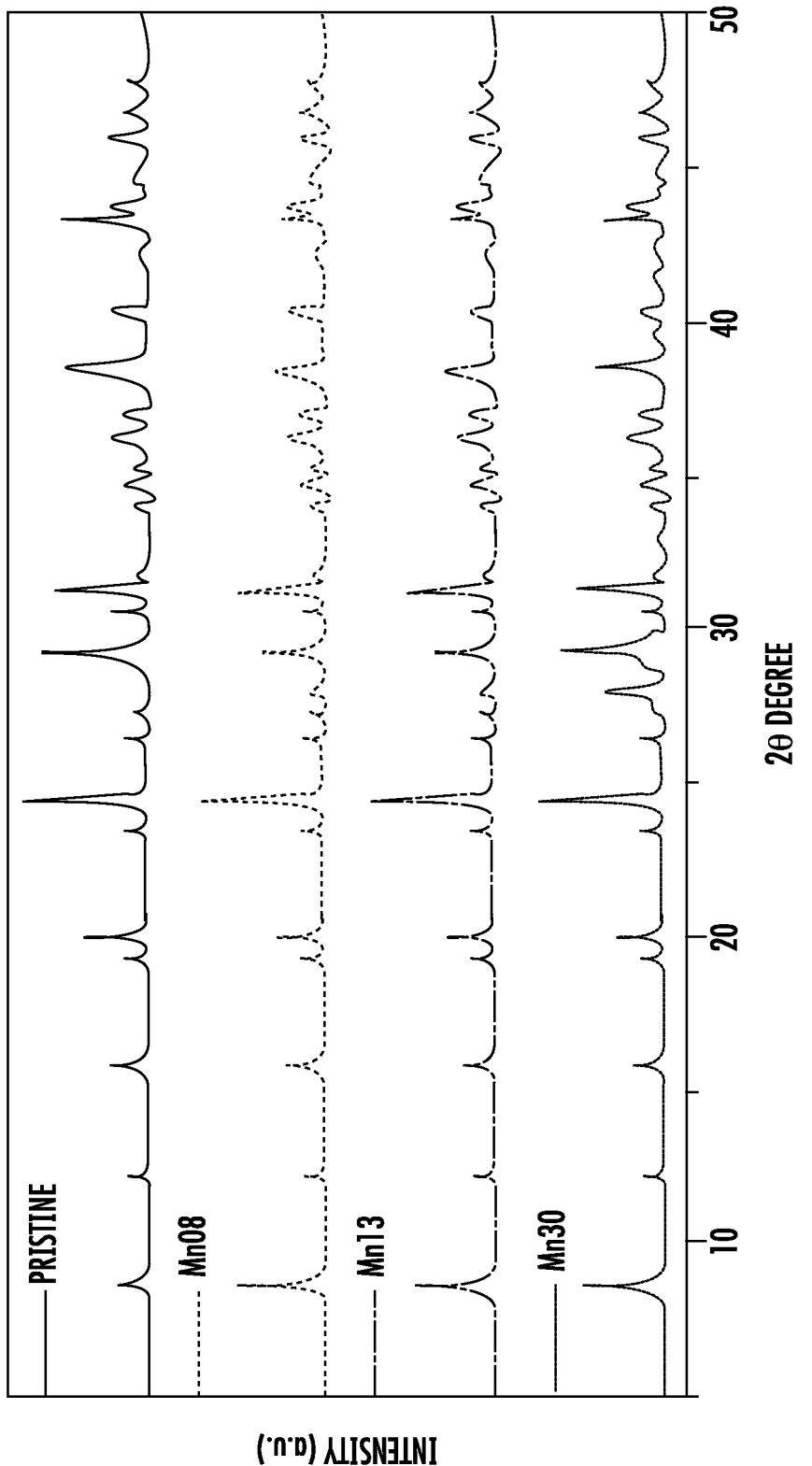
FIG. 22 depicts powder X-ray diffraction patterns of embodiments of pristine and Mn-doped 1D lead bromide perovskites.

FIG. 22 depicts the XRD patterns of the pristine and Mn-doped 1D perovskites. The almost identical powder XRD patterns suggest that there is no detectable phase change or separation resulting from the doping of $Mn^{2+}$ ions.

3. Absorption Spectrum Measurements

Absorption spectra of Mn-doped 1D perovskites were measured at room temperature through synchronous scan in an integrating sphere incorporated into the spectrofluorometer (FLS980, Edinburgh Instruments) while maintaining a 1 nm interval between the excitation and emission monochromators.

4. Photoluminescence Steady State Studies

Steady-state photoluminescence spectra of the Mn-doped 1D perovskites in solid state were obtained at room temperature on a FLS980 spectrofluorometer.

5. Photoluminescence Quantum Efficiencies (PLQEs)

The PLQEs were acquired using a Hamamatsu C9920 system equipped with a xenon lamp, calibrated integrating sphere and model C10027 photonic multi-channel analyzer (PMA). The PLQEs were calculated by the equation: $\eta_{QE}=I_S/(E_R-E_S)$, in which Is represents the luminescence emission spectrum of the sample, $E_R$ is the spectrum of the excitation light from the empty integrated sphere (without the sample), and $E_S$ is the excitation spectrum for exciting the sample.

6. Time-Resolved Photoluminescence

Time-Resolved Emission data were collected at room temperature using the FLS980 spectrofluorometer. The dynamics of emission decay were monitored by using the FLS980's time-correlated single-photon counting capabilitiy (1024 channels; 500 ns window) with data collection for 10,000 counts. Excitation was provided by an Edinburgh EPL-360 picosecond pulsed diode laser. Long lifetime measurements (1024 channels; 20 ms window) were collected using Xe flash lamp as the excitation source. The average lifetime was obtained by multiexponential fitting.

The optical properties of the as-prepared Mn-doped 1D perovskites of Example 6 were fully characterized. All of the samples of Example 6 were white powders under ambient light, but showed a wide range of "cold" to "warm" white emissions under UV irradiation (365 nm) depending on the $Mn^{2+}$ doping concentration.

Figure 23:
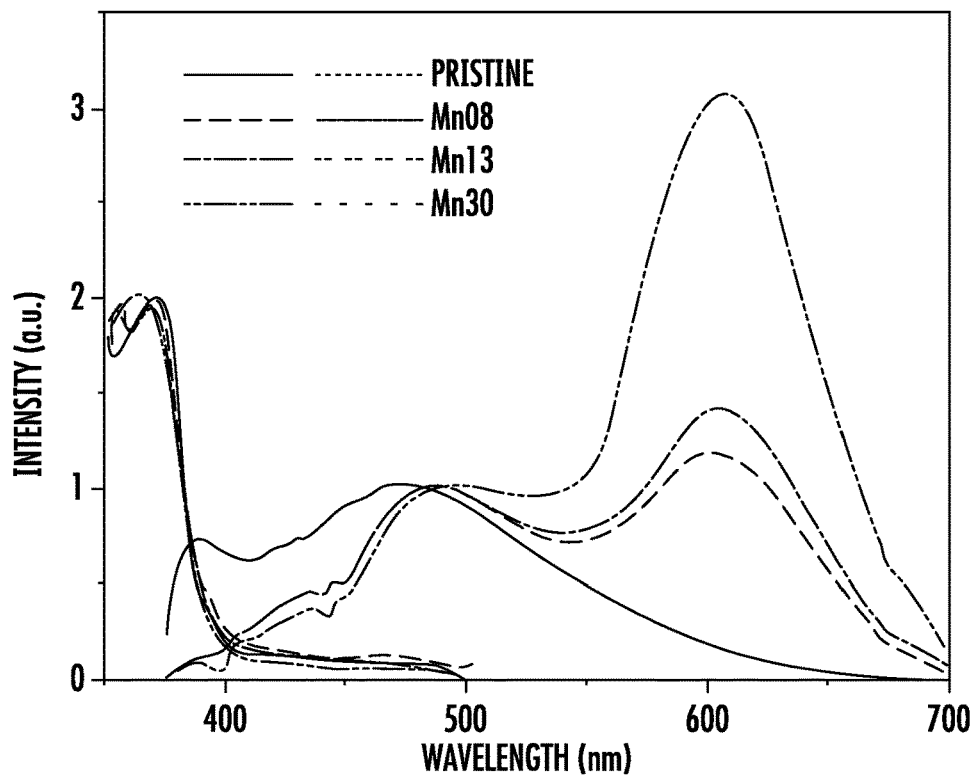
FIG. 23 depicts absorption (dash line) and emission (solid line) spectra of embodiments of pristine and Mn-doped 1D lead bromide perovskites.

The little-to-no change of the absorption spectra of FIG. 23 suggests the light absorption was primarily by the host 1D perovskites with minimum contributions from the doped $Mn^{2+}$ ions. The photoluminescence spectra of the pristine and Mn-doped 1D perovskites upon UV excitation at 355 nm are also shown at FIG. 23. In the pristine 1D perovskites, a dual emission was recorded with high-energy narrow band (peaked at ~390 nm) from the free exciton excited states and low-energy broadband (peaked at ~485 nm) from the self-trapped excited states. In the Mn-doped 1D perovskites, the near UV emission at ~390 nm was significantly quenched with an additional broadband emission peaked at ~605 nm observed, which was attributed to the ligand field transition ($^4T_1$ to $^6A_1$) of $Mn^{2+}$ ions.

Surprisingly, the blue emission from the self-trapped excited states remained relatively unchanged. By combining the self-trapped broadband blue emission from the 1D perovskites and the strong red emission from the $Mn^{2+}$ ions with the characteristic d-d transition, bright white emissions were realized in the Mn-doped 1D perovskites of Example 6. The perovskites of Example 6 were almost free from self-reabsorption issue that many other phosphors suffer (e.g. 3D materials) due to the effective large stokes shift.

Corresponding CIE coordinates of the emissions from the pristine and Mn-doped 1D perovskites of Example 6 also were collected. By controlling the $Mn^{2+}$ doping concentration, the CRI of these 1D perovskites could be increased from 66 to 87, and the correlated color temperature (CCT) reduced from 24154 K to 2459 K. The great color tunabilitiy of these Mn-doped 1D perovskites may allow for the development of optically pumped white light emitting diodes (WLEDs) with different photometric properties for various applications.

The PLQEs of the Mn-doped 1D perovskites in the form of microscale crystals were determined, with the highest value of about 28% for the sample (Mn13) containing 1.3% $Mn^{2+}$ doping, representing a significant improvement over that of the pristine 1D perovskites of about 12%. A larger amount of $Mn^{2+}$ doping resulted in a decrease in PLQE, which was likely attributed to the surface or internal defects from excessive doping. The PLQEs, along with other photophysical properties of the Mn-doped 1D perovskites of Example 6 are provided in the following table:

Photophysical Properties of the Pristine and Mn-Doped 1D Lead Bromide Perovskites at Room Temperature

| Sample | $\lambda_{em}$ (nm) | PLQE (%) | Lifetime (ns) @ 450 nm | Lifetime (ms) @ 650 nm | CIE | CRI | CCT (K) |
|---|---|---|---|---|---|---|---|
| Pristine | 389, 475 | 10-12 | 22.6 | N/A | (0.21, 0.27) | 66 | 24154 |
| Mn08 | 484, 605 | 20-22 | 28.2 | 2.0 | (0.37, 0.37) | 87 | 4286 |
| Mn13 | 484, 605 | 25-28 | 26.9 | 1.9 | (0.39, 0.37) | 85 | 3767 |
| Mn30 | 486, 608 | 20-22 | 15.3 | 1.9 | (0.47, 0.40) | 78 | 2459 |

Time-resolved photoluminescence measurements were carried out to analyze the excited state dynamics of the Mn-doped 1D perovskites of Example 6 with multiple excited states, including free-exciton excited states, self-trapped excited states, and $Mn^{2+}$ transition states.

The luminescent decay profiles were monitored at two different emission peaks. The emission decay profiles collected at 450 nm were primarily from the contributions of the self-trapped excited states and a little amount of the free exciton excited states, which are in an equilibrium at room temperature. It was found that the 450 nm emissions of Mn08 and Mn13 had longer lifetimes of about 27 ns than that of the pristine 1D perovskites of about 22 ns, which was likely due to the influence of the $Mn^{2+}$ doping on the competitive kinetics between the radiative and nonradiative decays. A small amount of $Mn^{2+}$ dopants may remove the preexisting structural defects accounting for the nonradiative decays.

With further increase of the doping concentration to 3%, the lifetime of the 450 nm emission deceased to about 15 ns, which could be attributed to two reasons. First, the internal or surficial defects by excessive $Mn^{2+}$ ions may have sped up the nonradiative relaxation process. Secondly, the higher doping concentration may have led to higher energy transfer from the free exciton excited states to the $Mn^{2+}$ ions, also resulting in enhanced nonradiative decay of the free exciton excited states.

The decay profiles of emissions from $Mn^{2+}$ ions at 650 nm also were collected. The lifetimes for the emissions of the three Mn-doped 1D perovskites were calculated to be identical of about 1.9 ms. Such extremely long lifetimes confirmed their origination from the spin-forbidden ligand field transition ($^4T_1$ to $^6A_1$) of the doped $Mn^{2+}$ ions. Unlike typical Mn-doped inorganic crystals and metal halide perovskites with only direct band-edge emission and $Mn^{2+}$ emission, the class of Mn-doped 1D perovskites of Example 6 could have emissions from the direct free exciton and indirect self-trapped excited states, as well as $Mn^{2+}$ ions.

Figure 24:
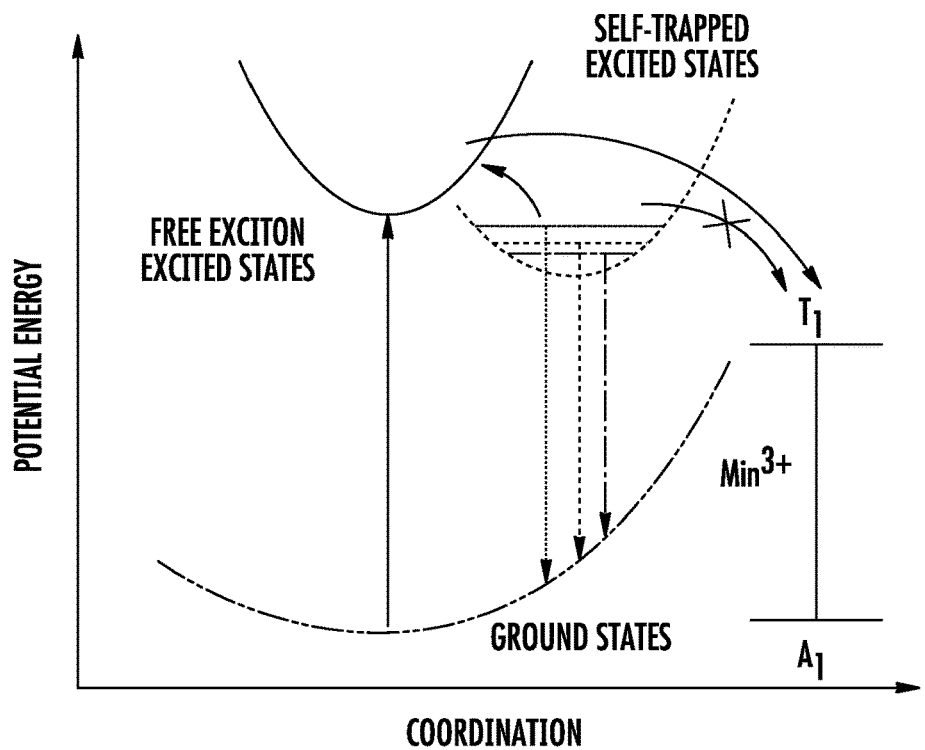
FIG. 24 depicts a proposed energy diagram and excited state dynamics of embodiments of Mn-doped 1D lead bromide perovskites (the straight and curved arrows represent optical and energy relaxation/transfer transitions, respectively).

The excited state dynamics of the Mn-doped 1D perovskites of Example 6 is depicted at FIG. 24. Upon UV photo absorption, the system was excited to the direct free exciton excited states, which can undergo energy relaxation/transfer to both the indirect self-trapped excited states and $Mn^{2+}$ ions simultaneously. The dual emission from the self-trapped excited states and $Mn^{2+}$ ions suggested that these two energy transfer processes are likely competitive with similar time scales. The same excitation of indirect self-trapped emission and $Mn^{2+}$ emission confirmed their identical origin from the free exciton excited states by direct band absorption.

Higher $Mn^{2+}$ doping concentration may lead to enhanced energy transfer from the free exciton excited states to the $Mn^{2+}$ ions. Unlike the self-trapped excited states creating a thermal equilibrium with the free exciton excited states in the pristine 1D perovskites, the $Mn^{2+}$ ions possess no back energy transfer to the free exciton excited states in the Mn-doped 1D perovskites, due to the large energy offset. This likely explains why the deep blue emission from the free exciton excited states was significantly quenched. On the other hand, the energy transfer from the self-trapped excited states to the $Mn^{2+}$ ions was not allowed, although the transitions from the self-trapped excited states to the ground state had a larger energy difference with blue emission than that of $Mn^{2+}$ ions with red emission. This was likely because the self-trapped excited states were indirect transient states with unpopulated ground states that could block electron exchange in Dexter energy transfer.

Overall, multiple excited states co-existed in the Mn-doped 1D perovskites of Example 6 to generate white emissions in the steady state. Here the intrinsic indirect self-trapped excited states of the host material replace one of the doping ions, thereby significantly simplifying the material preparation process. To further prove the proposed mechanism and that there was no direct energy transfer from the self-trapped excited states to $Mn^{2+}$ ions, the emission of Mn13 and the decay lifetimes at 77 K also were measured. A much higher intensity of emission from the indirect self-trapped excited states than that of emission from $Mn^{2+}$ ions was observed. This was expected, as there is no thermally activated equilibrium between the free exciton and self-trapped excited states at low temperature, suspending the back energy transfer from the self-trapped excited states to the free exciton excited states that will be quenched by the $Mn^{2+}$ ions.

Also the emission from the self-trapped excited states had much higher PLQE with longer lifetime at 77 K than at room temperature.

We claim:

1. A method of making a metal halide perovskite, the method comprising:
    providing a liquid formulation comprising (i) a metal halide, (ii) an organic ligand, (iii) an organic acid, and (iv) a liquid hydrocarbon; and
    agitating the liquid formulation to form a metal halide perovskite having a 1D crystal structure,
    wherein the organic ligand comprises at least one secondary amine, at least one tertiary amine, or a combination thereof.

2. The method of claim 1, further comprising centrifuging the liquid formulation to isolate the metal halide perovskite having a 1D crystal structure.

3. The method of claim 1, wherein the liquid hydrocarbon comprises a $C_4$-$C_{10}$ hydrocarbon.

4. The method of claim 1, wherein the organic acid is a $C_1$-$C_{20}$ hydrocarbyl substituted with at least one carboxylic acid functional group.

5. The method of claim 1, wherein the organic acid is a $C_4$-$C_{12}$ hydrocarbyl substituted at the 1-position with a carboxylic acid functional group.

6. The method of claim 1, wherein the organic acid comprises octanoic acid.

7. The method of claim 1, wherein the metal halide is selected from the group consisting of a metal chloride, a metal bromide, a metal iodide, and a combination thereof.

8. The method of claim 1, wherein the metal halide is selected from the group consisting of lead (II) chloride, lead (II) bromide, lead (II) iodide, and a combination thereof.

9. A method of making a metal halide perovskite, the method comprising:
    providing an aqueous formulation comprising (i) a metal halide, (ii) an organic ligand, and (iii) a hydrogen halide; and contacting the aqueous formulation with a precipitant to form a metal halide perovskite having a 1D crystal structure, wherein the precipitant is a polar precipitant;

wherein the organic ligand comprises at least one secondary amine, at least one tertiary amine, or a combination thereof.

10. The method of claim 9, wherein the contacting of the aqueous formulation with the precipitant comprises diffusing the precipitant into the aqueous formulation.

11. The method of claim 9, wherein the precipitant is acetone.

12. The method of claim 9, wherein the metal halide is selected from the group consisting of a metal chloride, a metal bromide, a metal iodide, and a combination thereof.

13. The method of claim 9, wherein the metal halide is selected from the group consisting of lead (II) chloride, lead (II) bromide, lead (II) iodide, and a combination thereof.

14. A method of making a doped metal halide perovskite, the method comprising:

providing a precursor formulation comprising (i) a metal halide, (ii) an organic cation, (iii) a manganese halide, and (iv) a liquid; and contacting the precursor formulation with a precipitant to form a doped metal halide perovskite, wherein the organic cation comprises at least one secondary ammonium cation, at least one tertiary ammonium cation, or a combination thereof, and a mol ratio of the metal halide to the manganese halide in the precursor formulation is about 8:1 to about 1:1.

15. The method of claim 14, wherein the metal halide is selected from the group consisting of a metal chloride, a metal bromide, a metal iodide, and a combination thereof.

16. The method of claim 14, wherein the metal halide is selected from the group consisting of lead (II) chloride, lead (II) bromide, lead (II) iodide, and a combination thereof.

17. The method of claim 14, wherein the contacting of the precursor formulation with the precipitant occurs at room temperature.

18. The method of claim 14, wherein the liquid is a polar organic solvent.

19. The method of claim 18, wherein the polar organic solvent is selected from the group consisting of dimethylformamide, dimethyl sulfoxide, and γ-butyrolactone.

* * * * *